(12) United States Patent
Tomita et al.

(10) Patent No.: US 11,888,020 B2
(45) Date of Patent: Jan. 30, 2024

(54) SEMICONDUCTOR DEVICE, SOLID-STATE IMAGING DEVICE, AND METHOD FOR MANUFACTURING SEMICONDUCTOR DEVICE

(71) Applicant: SONY SEMICONDUCTOR SOLUTIONS CORPORATION, Kanagawa (JP)

(72) Inventors: Chihiro Tomita, Kanagawa (JP); Shintaro Okamoto, Kanagawa (JP); Tomohiro Hirai, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 336 days.

(21) Appl. No.: 17/429,854

(22) PCT Filed: Feb. 7, 2020

(86) PCT No.: PCT/JP2020/004856
§ 371 (c)(1),
(2) Date: Aug. 10, 2021

(87) PCT Pub. No.: WO2020/170860
PCT Pub. Date: Aug. 27, 2020

(65) Prior Publication Data
US 2022/0130948 A1 Apr. 28, 2022

(30) Foreign Application Priority Data
Feb. 19, 2019 (JP) .................................. 2019-027081

(51) Int. Cl.
*H04N 25/75* (2023.01)
*H04N 25/79* (2023.01)
(Continued)

(52) U.S. Cl.
CPC ............. *H01L 28/60* (2013.01); *H04N 25/75* (2023.01); *H04N 25/79* (2023.01); *H01L 21/62* (2013.01);
(Continued)

(58) Field of Classification Search
CPC ... H01L 21/768; H01L 21/3205; H01L 21/62; H01L 23/5256; H01L 23/532;
(Continued)

(56) References Cited

U.S. PATENT DOCUMENTS 5,548,145 A    8/1996  Hamamoto et al.
5,818,109 A *  10/1998  Satake .............. H01L 23/53223
                                                    257/E23.152
(Continued)

FOREIGN PATENT DOCUMENTS

JP     07-176628 A    7/1995
JP     2004-119709 A  4/2004
(Continued)

OTHER PUBLICATIONS

International Search Report and Written Opinion of PCT Application No. PCT/JP2020/004856, dated Apr. 14, 2020, 09 pages of ISRWO.

*Primary Examiner* — Pritham D Prabhakher
(74) *Attorney, Agent, or Firm* — CHIP LAW GROUP

(57) ABSTRACT

The present disclosure relates to a semiconductor device, a solid-state imaging device, and a method for manufacturing a semiconductor device capable of improving the voltage dependency of a gate capacitance type.
Provided is a semiconductor device having a laminated structure in which a compound layer formed on a surface of a semiconductor layer and formed by the semiconductor layer reacting with metal, an insulating film layer in contact with the compound layer, and an electrode layer formed on
(Continued)

the insulating film layer are laminated. The present technology can be applied, for example, to an analog-to-digital (AD) conversion part included in the solid-state imaging device.

13 Claims, 19 Drawing Sheets

(51) Int. Cl.
| | | |
|---|---|---|
| *H01L 21/62* | (2006.01) | |
| *H01L 27/146* | (2006.01) | |
| *H01L 29/78* | (2006.01) | |
| *H01L 49/02* | (2006.01) | |

(52) U.S. Cl.
CPC ........ *H01L 27/14609* (2013.01); *H01L 29/78* (2013.01)

(58) Field of Classification Search
CPC ......... H01L 27/14612; H01L 27/14609; H01L 27/0629; H01L 29/7839; H01L 29/66643; H01L 29/94; H01L 29/78; H01L 28/60; H04N 25/75; H04N 25/79
USPC ....................................................... 348/294
See application file for complete search history.

(56) References Cited

U.S. PATENT DOCUMENTS

| | | | | |
|---|---|---|---|---|
| 7,355,265 | B2* | 4/2008 | Kinoshita | ........... H01L 23/5223 257/532 |
| 7,429,777 | B2* | 9/2008 | Tsuchiya | ............. H01L 27/1203 257/E21.585 |
| 7,470,612 | B2* | 12/2008 | Choi | ................. H01L 21/76876 257/E21.627 |
| 7,601,623 | B2* | 10/2009 | Tsuchiya | ......... H01L 21/823807 438/597 |
| 8,531,033 | B2* | 9/2013 | Koike | ............... H01L 21/76855 438/653 |
| 9,159,667 | B2* | 10/2015 | Zhang | ................. H01L 27/0617 |
| 9,461,171 | B2* | 10/2016 | Xie | ................... H01L 29/66628 |
| 2004/0062011 | A1 | 4/2004 | Kinoshita | |
| 2006/0192258 | A1* | 8/2006 | Tsuchiya | ........... H01L 21/28088 257/E21.585 |
| 2009/0283910 | A1* | 11/2009 | Hinomura | ......... H01L 21/76843 257/E23.168 |
| 2011/0063485 | A1* | 3/2011 | Nomura | .................. C09B 57/10 257/E51.027 |
| 2011/0156857 | A1* | 6/2011 | Kurz | .................. H01L 29/7848 337/414 |
| 2015/0028447 | A1* | 1/2015 | Zhang | .................. H01L 27/0617 257/529 |
| 2015/0060960 | A1* | 3/2015 | Xie | .................... H01L 21/76897 257/288 |
| 2015/0061042 | A1* | 3/2015 | Cheng | ............... H01L 21/28088 257/412 |
| 2015/0340497 | A1* | 11/2015 | Xie | .................. H01L 21/76897 438/300 |
| 2019/0067131 | A1* | 2/2019 | Liaw | ............... H01L 21/823814 |

FOREIGN PATENT DOCUMENTS

| | | |
|---|---|---|
| JP | 2008-004693 A | 1/2008 |
| JP | 2012-060088 A | 3/2012 |
| KR | 10-1995-0012731 A | 5/1995 |

* cited by examiner

SEMICONDUCTOR DEVICE, SOLID-STATE IMAGING DEVICE, AND METHOD FOR MANUFACTURING SEMICONDUCTOR DEVICE

CROSS REFERENCE TO RELATED APPLICATIONS

This application is a U.S. National Phase of International Patent Application No. PCT/JP2020/004856 filed on Feb. 7, 2020, which claims priority benefit of Japanese Patent Application No. JP 2019-027081 filed in the Japan Patent Office on Feb. 19, 2019. Each of the above-referenced applications is hereby incorporated herein by reference in its entirety.

TECHNICAL FIELD

The present disclosure relates to a semiconductor device, a solid-state imaging device, and a method for manufacturing a semiconductor device, and more particularly, to a semiconductor device, a solid-state imaging device, and a method for manufacturing a semiconductor device capable of improving the voltage dependency of a gate capacitance type.

BACKGROUND ART

For example, as capacitive elements, there are known elements of a metal-oxide-metal (MOM) type, a metal-insulator-metal (MIM) type, a gate capacitance type, and the like.

Patent Document 1 discloses a structure in which a silicide layer, formed by a reaction between a silicon layer reacting with metal, is included on the surface of the silicon layer. Further, Patent Document 2 discloses a Schottky source-drain structure.

CITATION LIST

Patent Document

Patent Document 1: Japanese Patent Application Laid-Open No. 2012-60088
Patent Document 2: Japanese Patent Application Laid-Open No. 2008-4693

SUMMARY OF THE INVENTION

Problems to be Solved by the Invention

Meanwhile, the voltage dependency of the element of the gate capacitance type is inferior to those of other capacitive elements, and it has thus been required to improve the voltage dependency.

The present disclosure has been made in view of such a situation and is intended to improve the voltage dependency of the gate capacitance type.

Solutions to Problems

A semiconductor device according to one aspect of the present disclosure is a semiconductor device having a laminated structure in which a compound layer formed on a surface of a semiconductor layer and formed by the semiconductor layer reacting with metal, an insulating film layer in contact with the compound layer, and an electrode layer formed on the insulating film layer are laminated.

In a semiconductor device according to one aspect of the present disclosure, there is included a laminated structure in which a compound layer formed on a surface of a semiconductor layer and formed by the semiconductor layer reacting with metal, an insulating film layer in contact with the compound layer, and an electrode layer formed on the insulating film layer are laminated.

For a solid-state imaging device according to one aspect of the present disclosure, there is provided a solid-state imaging device including: a pixel part in which pixels each having a photoelectric conversion part are arranged two-dimensionally; and an analog-to-digital (AD) conversion part that converts analog signals from a plurality of the pixels into digital signals, the solid-state imaging device having a laminated structure in which a plurality of the pixels and the AD conversion part are formed on a semiconductor layer, and a compound layer formed on a surface of a semiconductor layer and formed by the semiconductor layer reacting with metal, an insulating film layer in contact with the compound layer, and an electrode layer formed on the insulating film layer are laminated.

The solid-state imaging device according to one aspect of the present disclosure includes: a pixel part in which pixels each having a photoelectric conversion part are arranged two-dimensionally; and an analog-to-digital (AD) conversion part that converts analog signals from a plurality of the pixels into digital signals, and a plurality of the pixels and the AD conversion part are formed on a semiconductor layer. Further, there is included a laminated structure in which a compound layer formed on a surface of a semiconductor layer and formed by the semiconductor layer reacting with metal, an insulating film layer in contact with the compound layer, and an electrode layer formed on the insulating film layer are laminated.

A method for manufacturing a semiconductor device according to one aspect of the present disclosure is a method for manufacturing a semiconductor device, the method including: forming an electrode layer on an insulating film layer; and forming a compound layer, formed by a semiconductor layer reacting with metal, on a surface of the semiconductor layer so as to come into contact with the insulating film layer.

In the method for manufacturing a semiconductor device according to one aspect of the present disclosure, an electrode layer is formed on an insulating film layer, and a compound layer, formed by the semiconductor layer reacting with metal, is formed on a surface of the semiconductor layer so as to come into contact with the insulating film layer.

Note that the semiconductor device and the solid-state imaging device according to one aspect of the present disclosure may be independent devices or internal blocks constituting one device.

MODE FOR CARRYING OUT THE INVENTION

Figure 1:
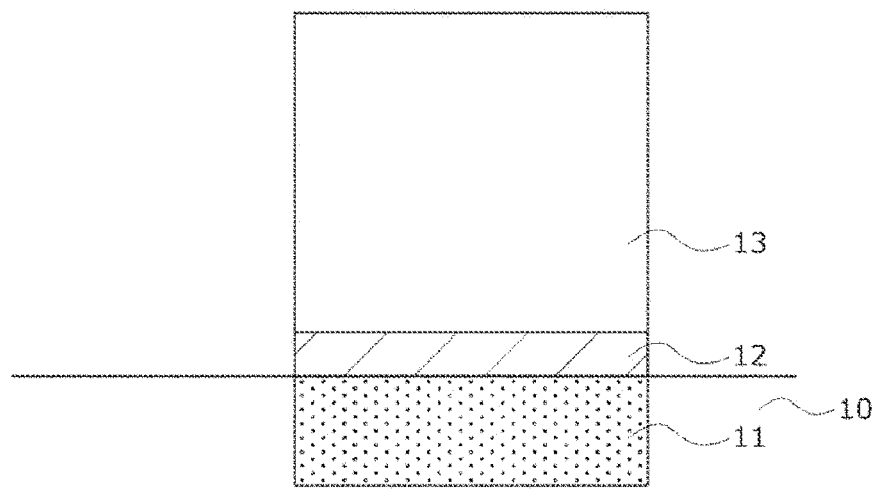
FIG. 1 is a sectional view illustrating a first example of a configuration of a main part of a semiconductor device to which a technology according to the present disclosure has been applied.

An embodiment of the technology according to the present disclosure (present technology) will be described below with reference to the drawings. Note that the description will be made in the following order:

1. Embodiment of present technology
2. Example of application to solid-state imaging device
3. Example of application to electronic equipment
4. Example of application to endoscopic surgical system
5. Example of application to moving object 1. Embodiment of the Present Technology (Configuration of Semiconductor Device)

FIG. 1 is a view illustrating a first example of a configuration of a main part of a semiconductor device to which the technology according to the present disclosure has been applied.

In FIG. 1, the semiconductor device to which the present technology has been applied has a laminated structure in which a compound layer 11, an insulating film layer 12, and an electrode layer 13 are laminated.

The compound layer 11 is formed on the surface of a semiconductor layer 10 of silicon (Si) or the like and is formed by the semiconductor layer 10 reacting with metal. For example, the compound layer 11 includes a silicide layer that uses a metal silicide containing metal and silicon (Si). The silicide layer includes, for example, at least one or more metals of titanium (Ti), cobalt (Co), and nickel (Ni).

The insulating film layer 12 includes an insulating film including, for example, a silicon oxide film ($SiO_2$), a hafnium oxide film ($HfO_2$), and the like. The electrode layer 13 includes an electrode including, for example, polycrystalline silicon (poly-Si: polysilicon), tungsten (W), tantalum (Ta), hafnium (Hf), silicide, or the like.

As described above, the semiconductor device to which the present technology has been applied has a structure in which the compound layer 11, the insulating film layer 12, and the electrode layer 13 are laminated, that is, a three-layer structure of a metal (electrode), an insulating film (oxide film), and a metal silicide (silicide), and has a structure as if being a metal-oxide-metal (MOM) type by the semiconductor substrate side (the surface of the semiconductor layer 10) being silicided. Therefore, the voltage dependency can be improved in a case where the gate capacitance type structure is used.

In other words, the MOM type is known as a structure having little voltage dependency among capacitive elements, but in the semiconductor device to which the present technology has been applied, since the semiconductor substrate side has the three-layer structure of the electrode, the oxide film, and the silicide, and the semiconductor substrate side has been silicided, a capacitance having characteristics such that a change in capacitance with respect to the gate voltage can be almost ignored can be achieved, and even in a case where the gate capacitance type structure is used, the voltage dependency can be improved.

In other words, in the three-layer structure illustrated in FIG. 1, compared to a general MOM type structure, not only the layout can be reduced in area but also the capacitance characteristics are improved (the capacitance becomes sufficiently large), so that the advantages of both the gate capacitance type and the MOM type can be enjoyed.

Figure 2:
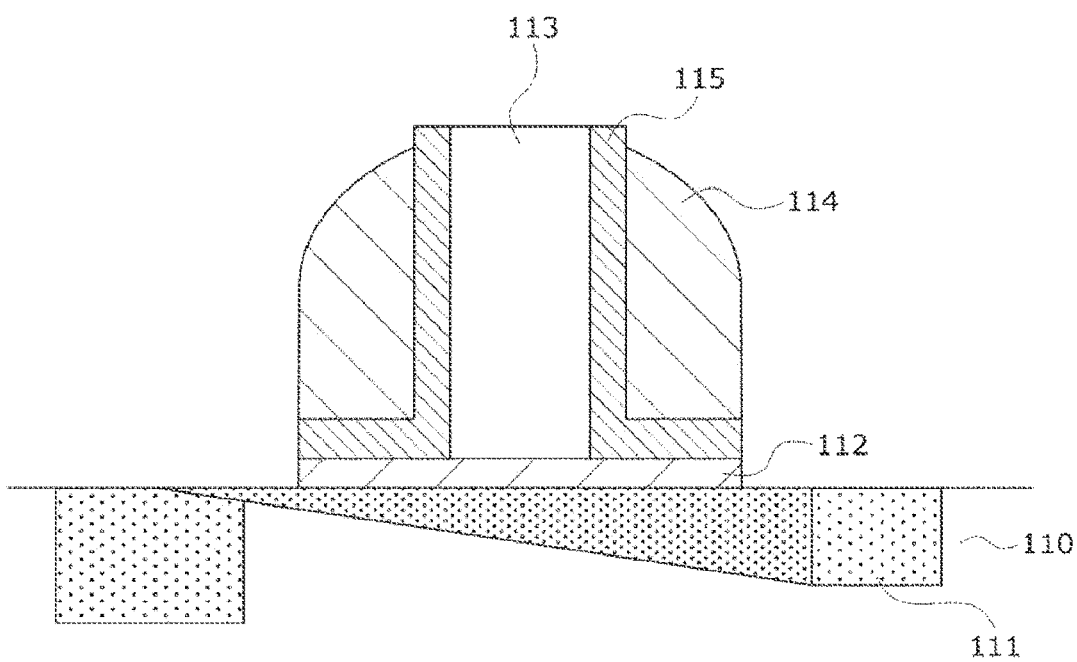
FIG. 2 is a sectional view illustrating a second example of the configuration of the main part of the semiconductor device to which the technology according to the present disclosure has been applied.

FIG. 2 is a view illustrating a second example of the configuration of the main part of the semiconductor device to which the technology according to the present disclosure has been applied.

In FIG. 2, in the semiconductor device, a planar structure is formed, and as a part of the structure, a laminated structure is formed in which a silicide 111, an insulating film 112, and a gate electrode 113 are laminated.

The silicide 111 is a compound layer formed on the surface of a semiconductor layer 110 of silicon (Si) or the like and formed by the semiconductor layer 110 reacting with metal. That is, the silicide 111 is a silicide layer that uses a metal silicide containing metal and silicon (Si). The silicide 111 includes, for example, at least one or more metals of titanium (Ti), cobalt (Co), and nickel (Ni).

In FIG. 2, the silicide 111 corresponds to a region represented by a dot pattern (including regions of coarse dots and fine dots) but is formed asymmetrically to the right and left. Note that, although the details will be described later, of the silicide 111, right and left square regions (rough-dot regions) represent a silicide formed in a manufacturing process, and a triangular region (fine-dot regions) in contact with the insulating film 112 represents a diffused silicide.

The insulating film 112 includes an insulating film including, for example, a silicon oxide film ($SiO_2$), a hafnium oxide film ($HfO_2$), and the like. The gate electrode 113 includes an electrode including, for example, polycrystalline silicon (poly-Si), tungsten (W), tantalum (Ta), hafnium (Hf), silicide, or the like.

The sidewall 114 is configured as a side-wall of the gate by using, for example, a silicon nitride film (SiN) or the like. In the sidewall 114, an insulating film 115 such as, for example, a silicon oxide film ($SiO_2$) is formed at a portion in contact with the gate electrode 113. Note that as the sidewall 114, a structure in which the insulating film 115 is not formed may be used.

Here, although the semiconductor device illustrated in FIG. 2 has the planar structure using the silicide 111 on the basis of a complementary metal-oxide-semiconductor (CMOS) process, the silicide 111 formed on the surface of the semiconductor layer 110 is formed using electromigration (EM) at the timing of the evaluation or the like after the formation of a field-effect transistor (FET) including the silicide 111 on the semiconductor layer 110.

Next, with reference to FIGS. 3A, 3B, 4, and 5, a description will be given of a method in which the silicide 111 is diffused using electromigration (EM) to form the silicide 111 in contact with the insulating film 112 on the surface of semiconductor layer 110.

Figure 3A:
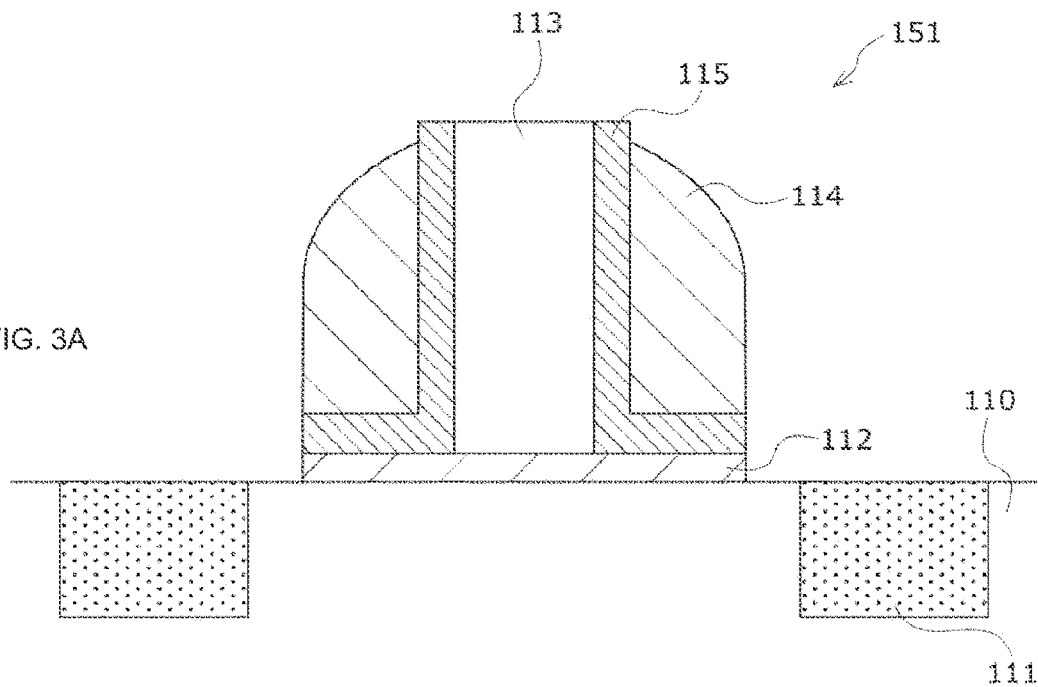
FIGS. 3A and 3B are sectional views schematically representing a state before and after electromigration (EM).

FIG. 3A illustrates a cross-sectional structure of a field-effect transistor 151 formed on the semiconductor layer 110. In the field-effect transistor 151, silicide 111 is formed on each of the right and left sources and drain portions relative to the gate electrode 113.

At this time, by applying a voltage to the silicide 111 formed in the source and drain portions, the silicide 111 is diffused, for example, from the drain side to the source side (or from the source side to the drain side) by electromigration (EM).

Figure 3B:
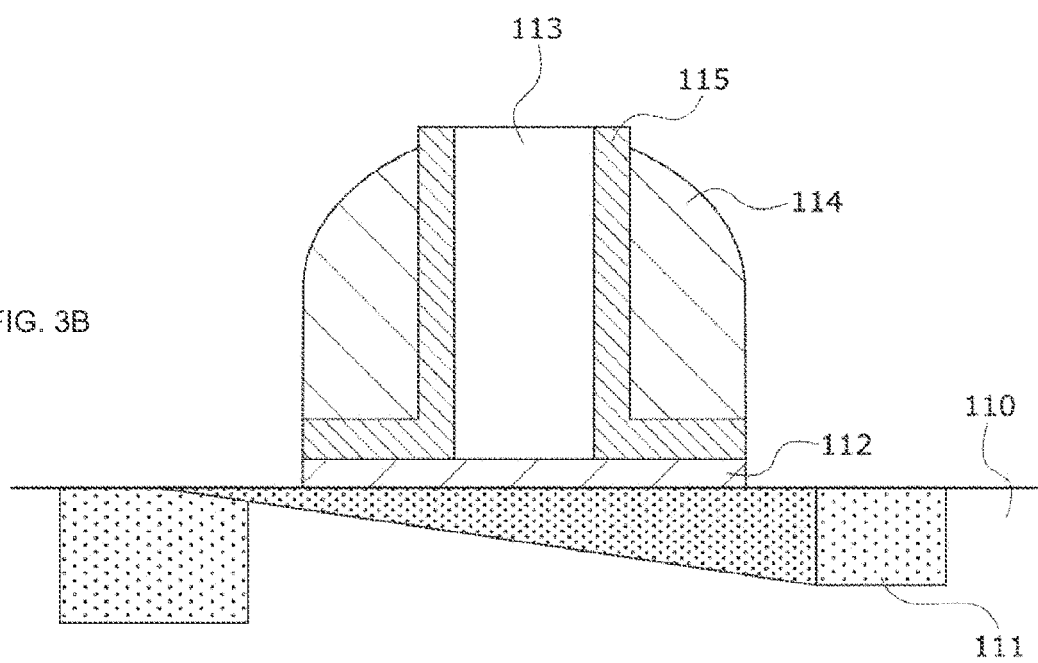

FIG. 3B illustrates a cross-sectional structure after the silicide 111 formed in the source and drain portions is diffused by electromigration (EM).

In FIG. 3B, the diffused silicide 111 is formed on the surface of the semiconductor layer 110 as an asymmetrical region (a region of dot pattern including coarse dots and fine dots) in contact with the insulating film 112, and by this diffusion, a laminated structure (three-layer structure) is formed in which the silicide 111, the insulating film 112, and the gate electrode 113 are laminated.

Figure 4:
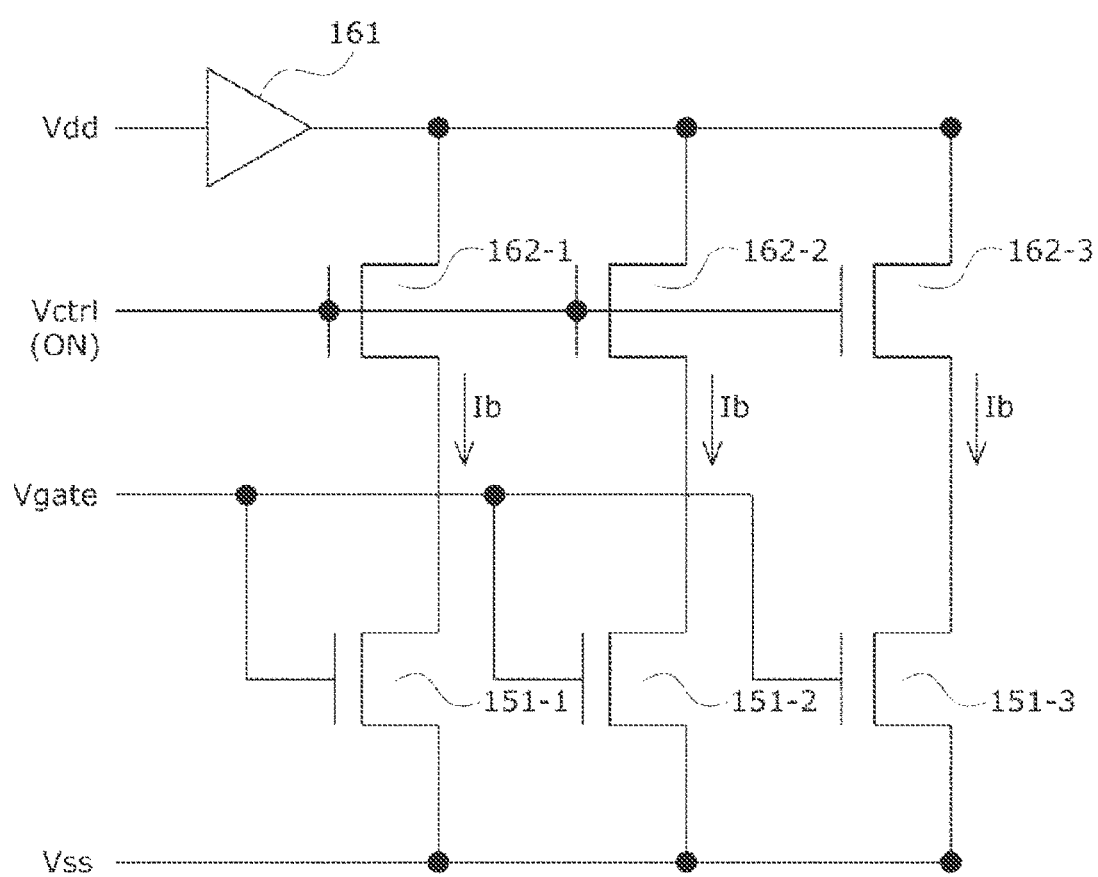
FIG. 4 is a circuit diagram illustrating an example of a circuit for performing blowing by electromigration (EM).

FIG. 4 illustrates an example of a circuit for performing blowing by electromigration (EM). In the blow circuit illustrated in FIG. 4, similarly to an E-Fuse, field-effect transistors 151-1 to 151-3 to be blown are connected in parallel.

This blow circuit is not the manufacturing process of the field-effect transistors 151-1 to 151-3 but is driven at the timing of the evaluation, and forms a capacitive element (capacitor), to which the present technology has been applied, by electromigration (EM). Further, the field-effect transistors 151-1 to 151-3 each have the structure illustrated in FIG. 3A, and the silicide 111 is formed on each of the source and drain portions.

In the field-effect transistor 151-1, the drain is connected to a power supply voltage 161 via a power supply line Vdd, and the source is connected to a power supply line Vss. Moreover, between the drain of the field-effect transistor 151-1 and the power supply line Vdd, a field-effect transistor 162-1 is connected.

The field-effect transistor 162-1 is turned on in accordance with a voltage Vctrl applied to its gate so that a blow current Ib from the power supply voltage 161 flows from the drain side to the source side of the field-effect transistor 151-1.

In this example, since the positive charge is applied to the drain of the field-effect transistor 151-1 by driving the blow circuit, the silicide of the channel is supplied from the source side, and the silicide 111 is diffused in the direction from the source side to the drain side by electromigration (EM).

Further, in the field-effect transistor 151-2,151-3, similarly to the field-effect transistor 151-1, each of the field-effect transistors 162-2,162-3 is turned on, and the blow current Ib from the power supply voltage 161 flows, whereby each silicide 111 is diffused in the direction from the source side to the drain side by electromigration (EM).

Here, electromigration (EM) occurs when metal ions have momentum due to accelerated electrons and move in the semiconductor substrate. That is, since the blow circuit illustrated in FIG. 4 illustrates a case where diffusion is performed from the minus side to the plus side (electron wind) as the diffusion of the silicide, the silicide of the channel is supplied from the source side and can be operated as a capacitive element (capacitor) by the terminals of the gate and the source after the formation of the silicide.

Figure 5:
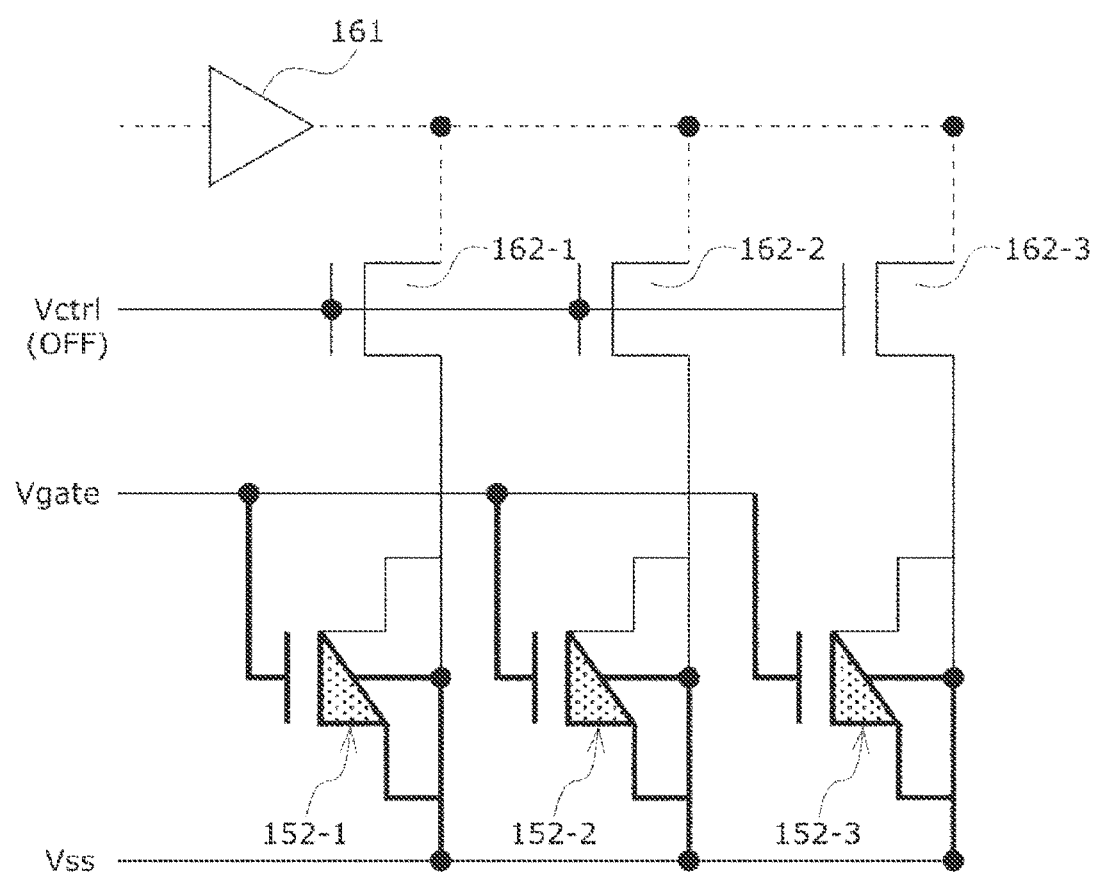
FIG. 5 is a circuit diagram illustrating an example of a circuit after blowing by electromigration (EM).

FIG. 5 illustrates an example of a circuit after blowing by electromigration (EM).

In FIG. 5, each of the field-effect transistors 162-1 to 162-3 is turned off in accordance with a voltage Vctrl applied to its gate, whereby each of the field-effect transistors 151-1 to 151-3 illustrated in FIG. 4 is in the state of being separated from the power supply voltage 161.

Thus, in a portion corresponding to the field-effect transistor 151-1, a three-layer structure in which the silicide 111, the insulating film 112, and the gate electrode 113 are laminated is formed and can be operated as a capacitive element 152-1 by the gate terminal (voltage: Vgate) and the source terminal (voltage: Vss).

Here, in this three-layer structure, since the silicide 111 is formed immediately below the insulating film 112 of the gate electrode 113, the carrier concentration of the semiconductor substrate can be held high regardless of the gate voltage, and the voltage dependency can be reduced.

Further, similarly, in a portion corresponding to each of the field-effect transistors 151-2,151-3, the three-layer structure in which the silicide 111, the insulating film 112, and the gate electrode 113 are laminated is formed and can be operated as each of capacitive elements 152-2, 152-3 by the gate terminal (voltage: Vgate) and the source terminal (voltage: Vss).

Note that, although the circuit diagrams of FIGS. 4 and 5 illustrate the case where the field-effect transistors 151-1 to 151-3 are formed in the semiconductor device in the manufacturing process, a similar configuration can be formed in a case where two or less, or four or more field-effect transistors 151 are formed.

In addition, in the field-effect transistor 151, by forming the insulating film 115 in contact with the gate electrode 113 on the sidewall 114, it is possible to prevent the short-circuiting of the gate and the source and the short-circuiting of the gate and the drain before and after the electromigration (EM).

Next, an example of the diffusion of the silicide 111 by electromigration (EM) will be described with reference to FIGS. 6 to 8.

Figure 6:
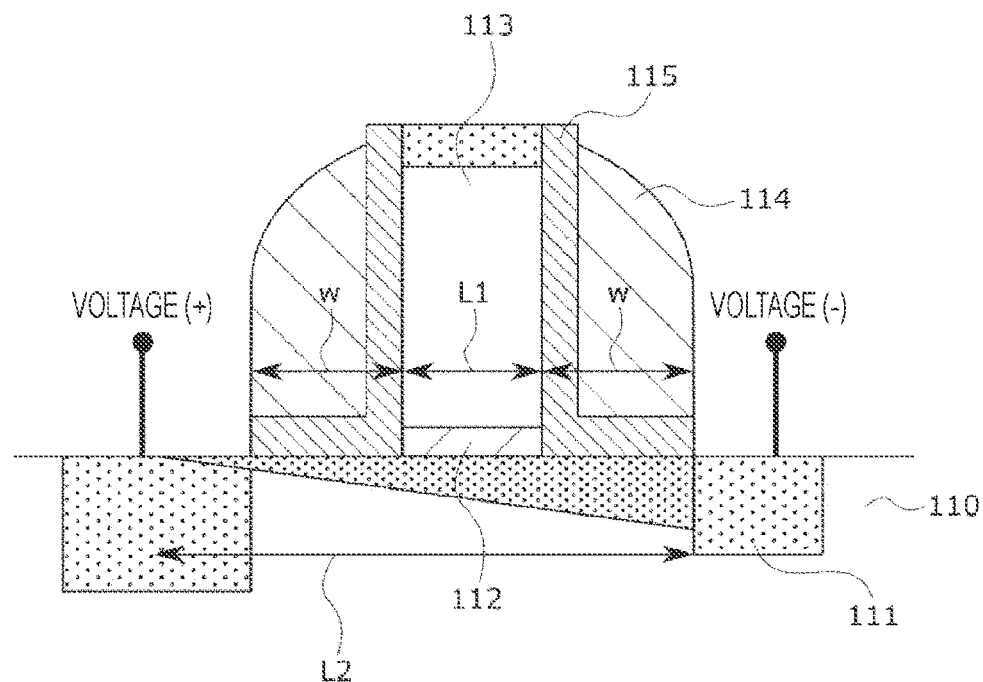
FIG. 6 is a sectional view illustrating a first example of diffusion of silicide.
Figure 7:
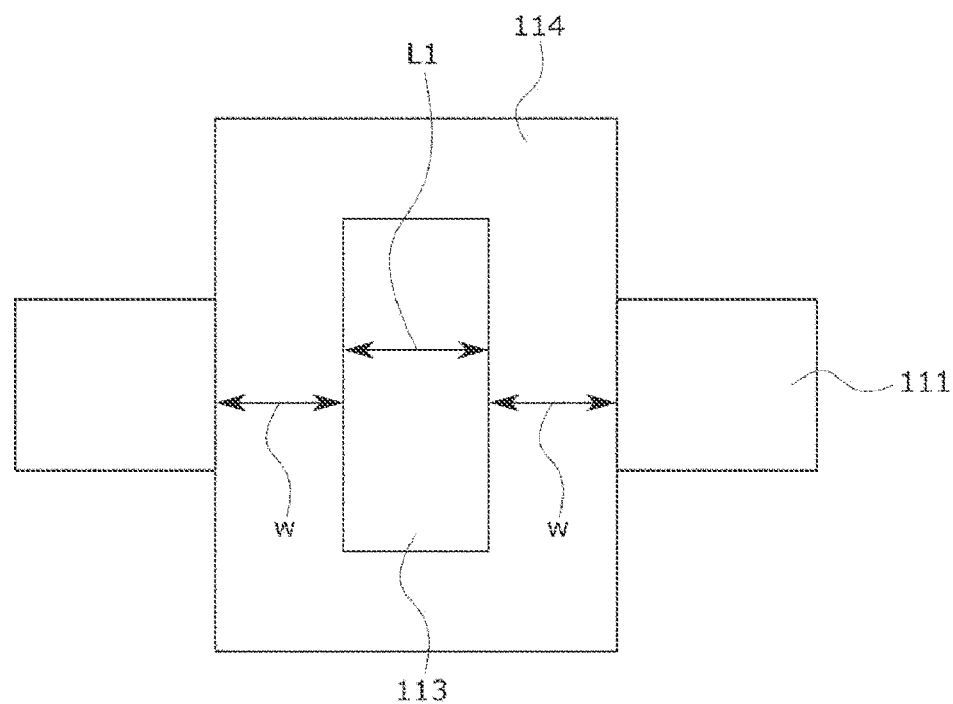
FIG. 7 is a top view illustrating the first example of the diffusion of silicide.

FIG. 6 illustrates a cross-sectional structure in a case where the diffusion of silicide 111 by electromigration (EM)

is appropriate. Further, FIG. 7 illustrates a top view corresponding to the sectional view illustrated in FIG. 6.

In FIG. 6, when the gate length of the gate electrode 113 is L1, the width of the sidewall 114 is W, and the diffusion length (hereinafter also referred to as EM diffusion length) of the silicide 111 by electromigration (EM) is L2, the relationship of the following formula (1) is obtained:

$$L2 > L1 + W \times 2 \quad (1)$$

Here, although the EM diffusion length L2 is generally determined by the voltage and the temperature, as the voltage, for example, such a voltage (relatively high voltage) as to satisfy the condition of the formula (1) described above in the blow circuit described above (FIG. 4) is only required to be applied. Moreover, the silicide 111 can be further diffused by, for example, setting the temperature to be high, thus increasing the diffusion length L2.

Note that in the present technology, the EM diffusion length L2 can be determined by at least the voltage so as to satisfy the condition of the formula (1). However, the gate length L1 is shorter than the diffusion length L2.

FIG. 6 illustrates a situation where the silicide 111 moves so as to be pulled out from the voltage (−) side to the voltage (+) side when the voltage is applied from the voltage (+) side to the voltage (−) side, that is, from the source side to the drain side. That is, in this example, the silicide 111 in the region on the voltage (−) side diffuses (tapers and extends) in the direction from the voltage (−) side to the voltage (+) side and reaches the silicide 111 in the region on the voltage (+) side.

At this time, the region of the silicide 111 (the region of the dot pattern including coarse dots and fine dots) includes regions having different concentrations.

For example, in FIG. 6, when the voltage is applied to the voltage (+) side and the voltage (−) side, the silicide 111 is extracted from the voltage (−) side, so that the concentration of the silicide 111 in the voltage (−) side region is thinner than that of the silicide 111 in the voltage (+) side region. That is, the silicide 111 in the region on the voltage (−) side and the silicide 111 in the region on the voltage (+) side have different concentrations.

Moreover, as for the material of the silicide 111, for example, a metal such as titanium (Ti), cobalt (Co), or nickel (Ni) can be used as described above, but among these metals, nickel (Ni) is the most easily diffused metal, and in consideration of this, for example, such a voltage as to satisfy the condition of the formula (1) is only required to be applied.

Thus, in FIG. 6, the EM diffusion length L2 determined by the voltage and the like has the relationship of the formula (1), and the diffusion of the silicide 111 reaches from the voltage (−) side to the voltage (+) side, so that the operation as a capacitive element is possible using the gate and drain terminals.

Note that, although the voltage (+) side is referred to as the source side, and the voltage (−) side is referred to as the drain side in FIG. 6, since the voltage applied from either side of the source and the drain is structurally the same, the source and the drain may be reversed.

Figure 8:
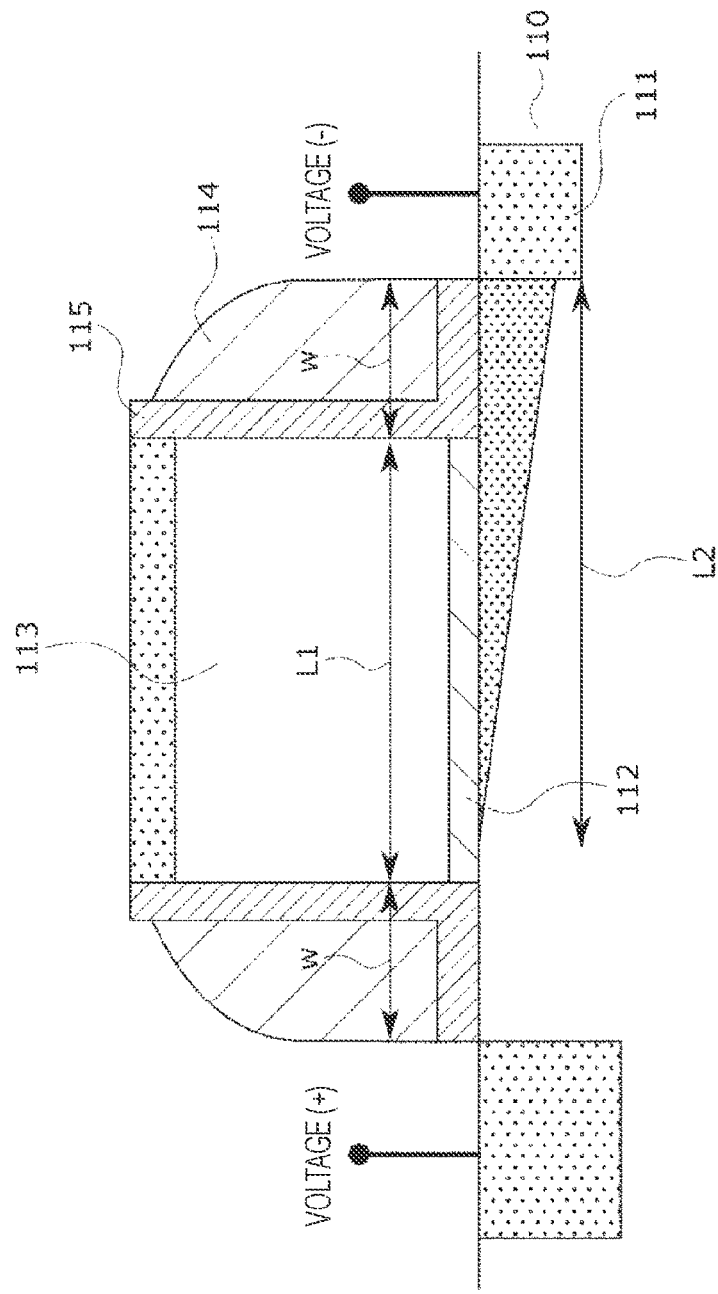
FIG. 8 is a sectional view illustrating a second example of the diffusion of silicide.

Further, FIG. 8 illustrates a cross-sectional structure in a case where the diffusion of silicide 111 by electromigration (EM) is short.

In FIG. 8, similarly to FIG. 6, when the gate length, the side-wall width, and the EM diffusion length are L1, W, and L2, respectively, the relationship (2) of the following formula is obtained.

$$L2 < L1 + W \times 2 \quad (2)$$

That is, in FIG. 8, the EM diffusion length L2 determined by the voltage and the like has the relationship of the formula (2), and the diffusion of the silicide 111 has not reached the region from the voltage (−) side to the voltage (+) side. Here, in a case where the relationship of the formula (2) is satisfied, the characteristics and the like can be improved compared to a case where the silicide 111 is not formed on the surface of the semiconductor layer 110 (a case where the three-layer structure to which the present technology has been applied is not provided), although the characteristics, variations, and the like are less sufficient compared to those in the case where the relationship of the formula (1) described above is satisfied.

As described above, after the field-effect transistor 151 is manufactured by the normal CMOS process flow, the voltage is applied between the drain and the source of the desired gate capacitance to (selectively) diffuse the silicide 111 by electromigration (EM), thereby forming the laminated structure (three-layer structure) in which the silicide 111, the insulating film 112, and the gate electrode 113 are laminated.

As a result, the capacitive element including the three-layer structure is formed, and since the silicide 111 is formed immediately below the insulating film 112, the carrier concentration of the semiconductor substrate can be held high regardless of the voltage (Vgate) of the gate terminal, and the voltage dependency of the gate capacitance type can be improved.

(Other Configurations of Semiconductor Device)

Although the above description has exemplified the planar structure using the silicide 111 on the basis of the CMOS process, the present technology is not limited to the planar structure and can be applied to other structures. Next, cases, where the present technology is applied to structures except for the planar structure, will be described with reference to FIGS. 9 to 11.

Figure 9:
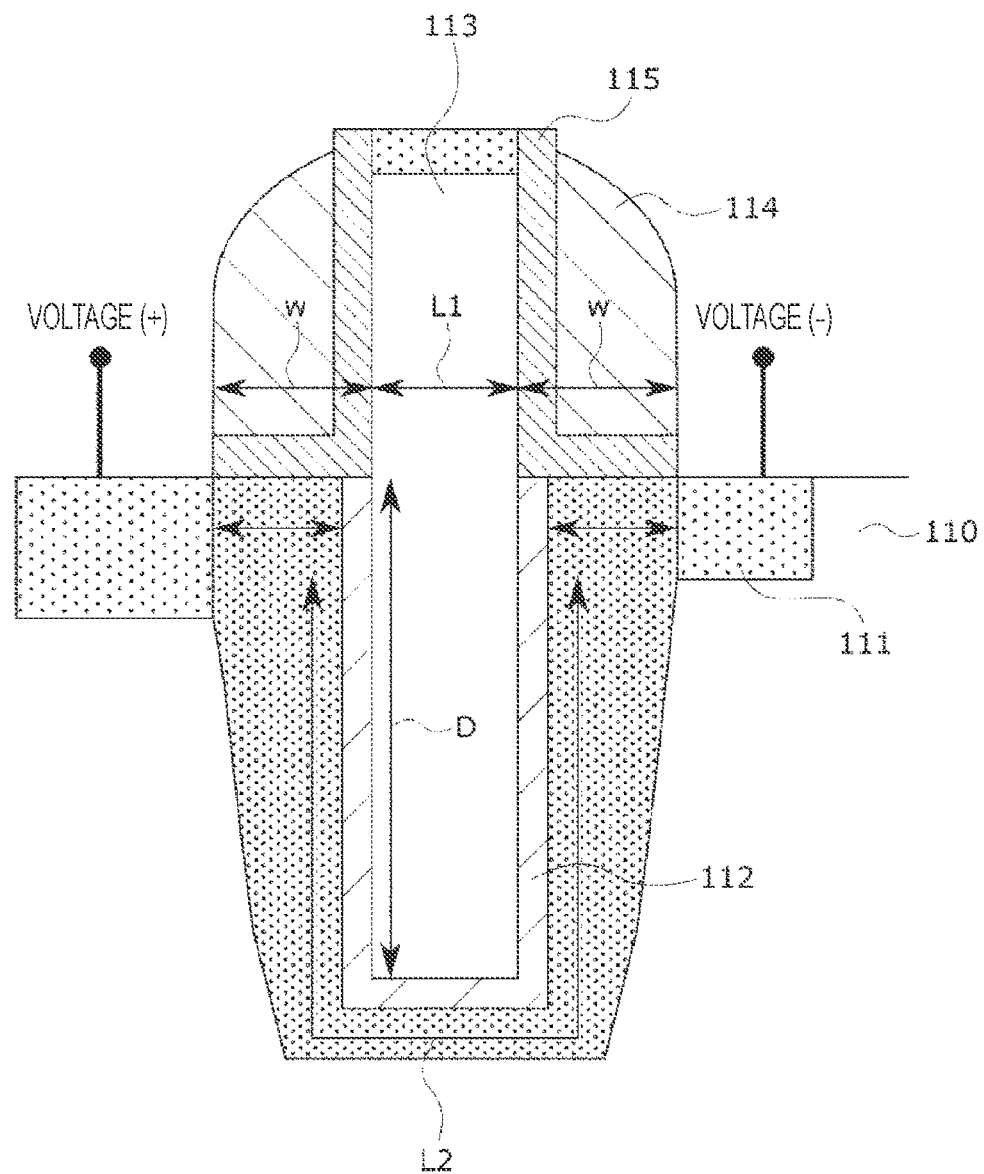
FIG. 9 is a sectional view illustrating a third example of the configuration of the main part of the semiconductor device to which the technology according to the present disclosure has been applied.

FIG. 9 illustrates a trench gate type structure (trench-gate structure) in which a groove is formed in the semiconductor layer 110 and the gate electrode 113 is embedded therein.

In the trench-gate structure, similarly to the planar structure described above, a voltage is applied between the source and the drain of the channel portion to diffuse the silicide 111 by electromigration (EM), thereby siliciding the channel. Thus, in the case of the trench-gate structure as well, the laminated structure (three-layer structure) in which the silicide 111, the insulating film 112, and the gate electrode 113 are laminated is formed.

Further, in FIG. 9, assuming that the gate length of the gate electrode 113 is L1, the width of the sidewall 114 is W, the depth of the trench is D, and the EM diffusion length is L2, for example, the relationship of the following formula (3) is established.

$$L2 > L1 + D \times 2 + W \times 2 \quad (3)$$

That is, in FIG. 9, in a case where the EM diffusion length L2 determined by the voltage and the like has, for example, the relationship of the formula (3), and the diffusion of the silicide 111 has reached between the source and the drain, the operation as a capacitive element is possible.

Figure 10:
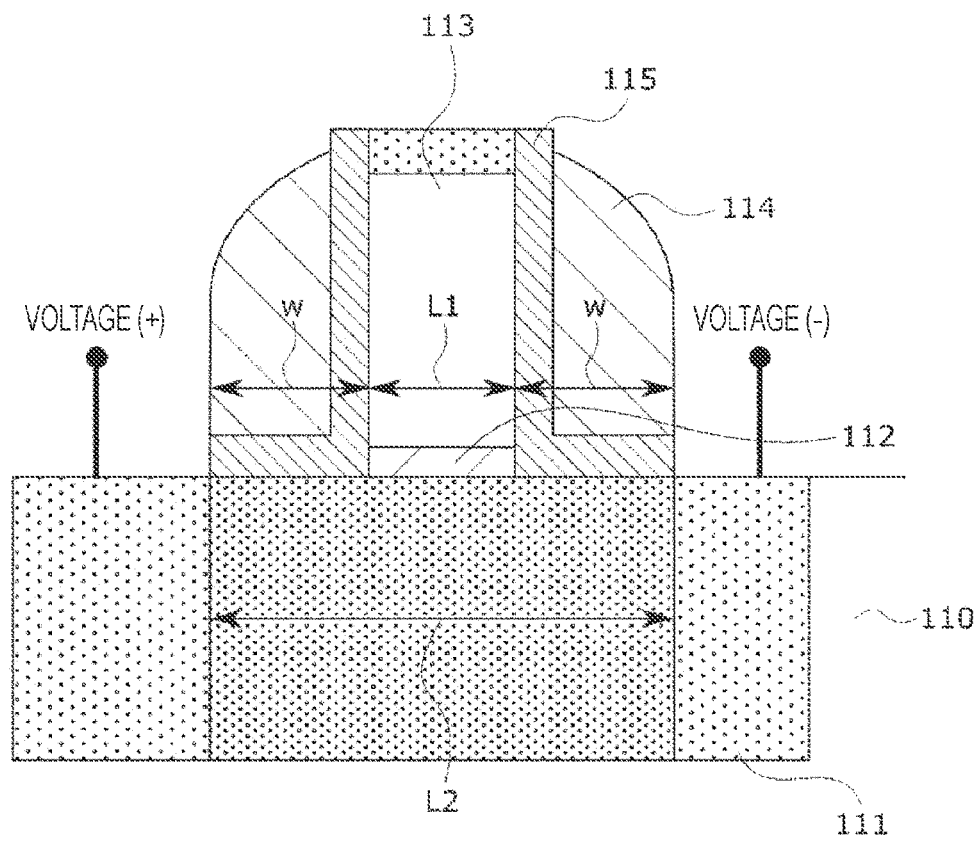
FIG. 10 is a sectional view illustrating a fourth example of the configuration of the main part of the semiconductor device to which the technology according to the present disclosure has been applied.
Figure 11:
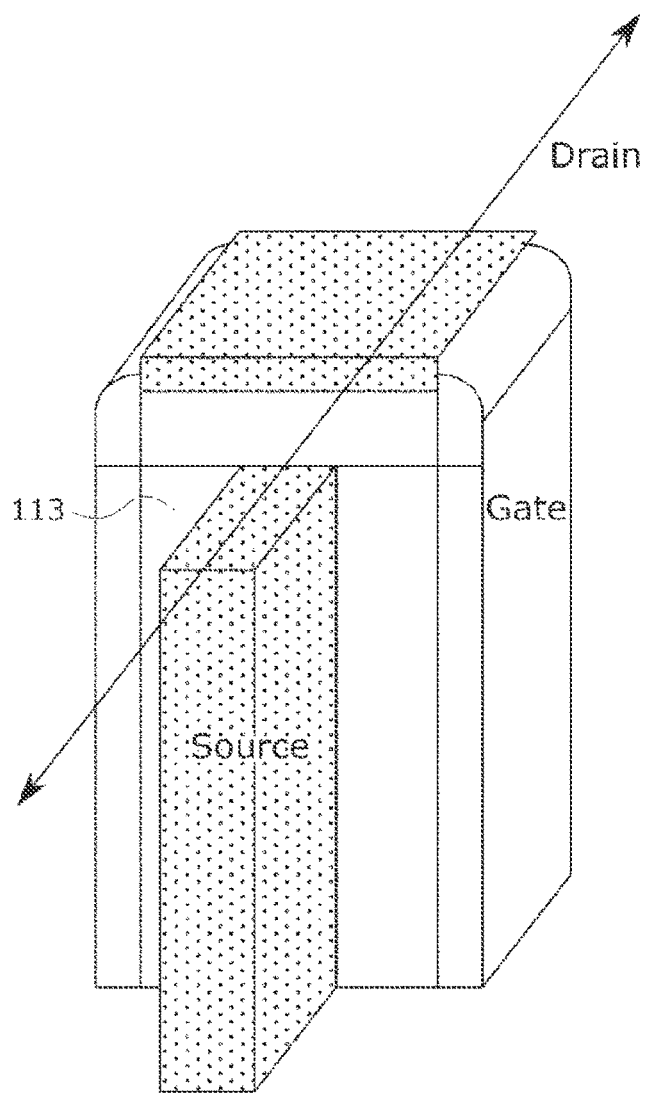
FIG. 11 is a view representing an example of a fin structure in three dimensions.

FIGS. 10 and 11 illustrate a three-dimensional structure (fin structure) in which channels are surrounded by gates from multiple directions.

In this fin structure, similarly to the planar structure described above, a voltage is applied between the source and the drain of the channel portion to diffuse the silicide 111 by electromigration (EM), thereby siliciding the channel. Thus, in the case of the fin structure as well, the laminated structure (three-layer structure) in which the silicide 111, the insulating film 112, and the gate electrode 113 are laminated is formed.

Further, in FIG. 10, assuming that the gate length of the gate electrode 113 is L1, the width of the sidewall 114 is W, and the EM diffusion length is L2, for example, the relationship of the following formula (4) is established.

$$L2 > L1 + W \times 2 \quad (4)$$

That is, in FIG. 10, in a case where the EM diffusion length L2 determined by the voltage and the like has the relationship of the formula (4), and the diffusion of the silicide 111 has reached between the source and the drain, the operation as a capacitive element is possible.

As described above, in the semiconductor device to which the present technology has been applied, the silicide is formed in the channel region, and the capacitive element (gate capacitive element) having the three-layer structure of the electrode, the oxide film, and the silicide is provided. In this capacitive element, with the semiconductor substrate side having been silicided, a capacitance having such a characteristic that a change in capacitance with respect to the gate voltage can be almost ignored is achieved, and the voltage dependency can be improved even in a case where the gate capacitance type structure is used.

Note that Patent Documents 1 and 2 described above disclose the structure including the silicide layer formed by a silicon layer reacting with metal on the surface of the silicon layer and the Schottky source-drain structure but do not disclose the three-layer structure (electrode, oxide film, silicide) to which the present technology has been applied.

2. Example of Application to Solid-State Imaging Device

Meanwhile, in a solid-state imaging device including a CMOS image sensor, as an analog-to-digital converter (ADC), an ADC of a single slope integration type is often used. The use of an ADC of a single slope integration type has the advantage that, for example, the layout can be reduced in area.

The capacitive element used in the AD converter is generally a MOM type using a wiring layer or a gate capacitance type because of affinity with a CMOS process, but the MOM type has the problem of having a more significant area penalty, while the gate capacitance type has the problem of being inferior in voltage dependency to cause nonlinear distortion occurs although an area-saving is possible.

The voltage dependency of the gate capacitance type is improved to some extent by increasing the substrate impurity concentration to 20 power or more, but the degradation of about 1% remains. In addition, in the formation process, high-temperature processes such as oxidation and a polysilicon gate are processed after the introduction of an N-type impurity with a high concentration, and hence variations due to outward diffusion also become a problem.

Here, it is possible to solve the problem if a metal (e.g., silicide, etc.) having higher conductivity than a semiconductor can be used on the semiconductor substrate side, but at present, an oxide film cannot be formed after the silicide process, and such a technology has thus not been achieved.

Therefore, in the present technology, as described above, the capacitive element (gate capacitive element) having the three-layer structure of the electrode, the oxide film, and the silicide is formed by applying a voltage between the source and the drain of the channel portion and diffusing silicide by electromigration (EM) to silicide the channel.

In this capacitive element, since the silicide is formed immediately below the oxide film of the gate electrode, the carrier concentration of the semiconductor substrate can be held high regardless of the gate voltage, so that the voltage dependency can be reduced.

Then, by using the capacitive element having excellent voltage dependency as a capacitive element used in, for example, the AD converter, it is possible to reduce nonlinear distortion in the ADC, and in the solid-state imaging device such as the CMOS image sensor, the image quality of a captured image obtained by capturing an image of a subject can be improved. Hereinafter, a description will be given of a configuration of a solid-state imaging device that includes the capacitive element having the three-layer structure as described above.

(Configuration of Solid-State Imaging Device)

Figure 12:
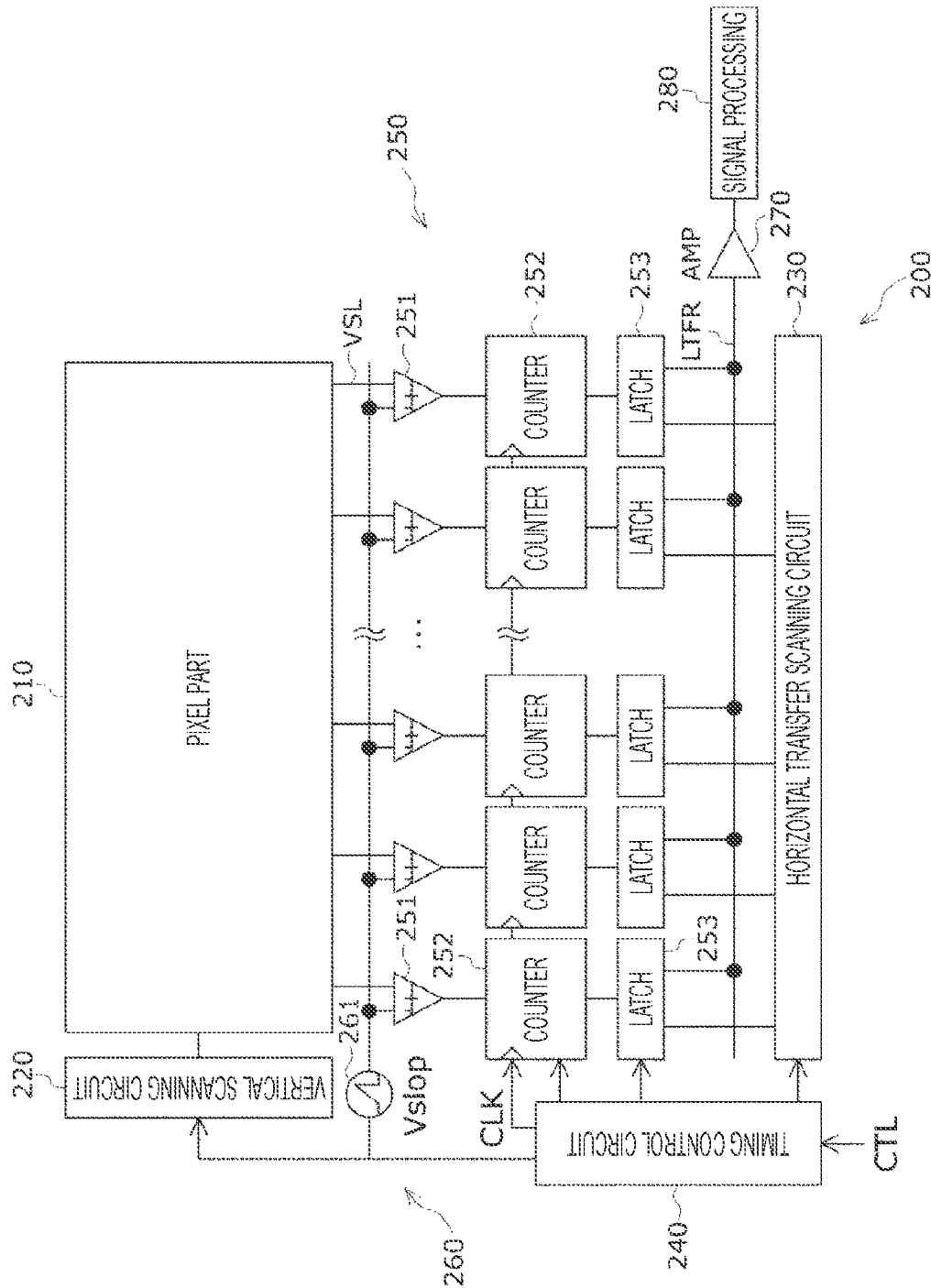
FIG. 12 is a block diagram illustrating an example of a configuration of a solid-state imaging device to which the technology according to the present disclosure has been applied.

FIG. 12 illustrates an example of a configuration of a solid-state imaging device to which the technology according to the present disclosure has been applied.

In FIG. 12, a solid-state imaging device 200 includes a pixel part 210, a vertical scanning circuit 220, a horizontal transfer scanning circuit 230, a timing control circuit 240, an AD converter 250, a digital-to-analog converter (DAC)-bias circuit 260, an amplifier circuit 270, and a signal processing circuit 280.

The pixel part 210 is constituted by arranging pixels, each including a photodiode (PD) and a pixel transistor, in a two-dimensional shape (matrix shape). Note that the detailed configuration of the pixels arranged in the pixel part 210 will be described later with reference to FIG. 13.

In the solid-state imaging device 200, the timing control circuit 240 for generating an internal clock, the vertical scanning circuit 220 for controlling a row address and row scan, and the horizontal transfer scanning circuit 230 for controlling a column address and a column scan are provided as control circuits for sequentially reading signals of pixel parts 210 (pixels arranged in the pixel part).

The timing control circuit 240 generates and supplies timing signals required for the pixel part 210, the vertical scanning circuit 220, the horizontal transfer scanning circuit 230, the AD converter 250, the DAC-bias circuit 260, and the signal processing circuit 280.

In the pixel part 210, an image is photoelectrically converted for each pixel row by photon accumulation and ejection using, for example, a line shutter, and the resulting analog signal is output to the AD converter 250 via a vertical signal line VSL.

In the AD converter 250, an integral ADC using a ramp signal (RAMP) from a digital-to-analog converter (DAC) 261 included in the DAC-bias circuit 260 and correlated double sampling (CDS) are performed on an analog signal from the pixel part 210 in each ADC block (each column part), and a several-bit digital signal is output.

Here, in the AD converter 250, ADCs are arranged in a plurality of columns, each of the ADCs including a comparator 251 for comparing a ramp signal generated by the DAC 261 with an analog signal (potential VSL) obtained from a pixel via the vertical signal line VSL for each row line, a counter 252 for counting a comparison time, and a latch 253 for holding a count result. Note that the ramp signal is a reference voltage Vslop having a ramp waveform (RAMP) obtained by making a stepwise change on a reference voltage generated by the DAC 261.

The AD converter 250 has an n-bit digital conversion function and is disposed for each vertical signal line VSL to constitute a column-parallel ADC block. The output of each latch 253 is connected to, for example, a horizontal transfer line LTFR having a width of 2n bits. Moreover, 2n amplifier circuits 270 and the signal processing circuits 280 corresponding to the horizontal transfer line LTFR are disposed. Note that the detailed configuration of the comparator 251 included in the AD converter 250 will be described later with reference to FIG. 14.

In the AD converter 250, an analog signal (potential VSL) read out to the vertical signal line VSL is compared with the reference voltage Vslop (a ramp signal having a slope waveform changing linearly with a certain inclination) by the comparator 251 disposed for each column (each column). At this time, in a similar manner to the comparator 251, the counter 252 disposed in each column operating, and the analog signal (potential VSL) of the vertical signal line VSL is converted into a digital signal by changing the ramp signal (potential Vslop) having the ramp waveform while taking one-to-one correspondence with a counter value.

Here, the change in the reference voltage Vslop (ramp signal) is to convert the change in the voltage into a change in time, and the time is counted at a certain period (clock) to be converted into a digital value. Then, when the analog signal (potential VSL) intersects with the ramp signal (reference voltage Vslop), the output of the comparator 251 is inverted, and the input clock of the counter 252 is stopped or a clock, having been stopped from being input, is input to the counter 252 to complete the AD conversion.

After the end of the period of the above AD conversion, the signal held in the latch 253 is transferred to the horizontal transfer line LTFR by the horizontal transfer scanning circuit 230 and is input to the signal processing circuit 280 via the amplifier circuit 270. In the signal processing circuit 280, predetermined signal processing (e.g., correction of a longitudinal line defect and a point defects, etc.) is performed on a signal to be input thereto, and an image signal obtained by the signal processing is output to a subsequent stage.

(Configuration of Pixel)

Figure 13:
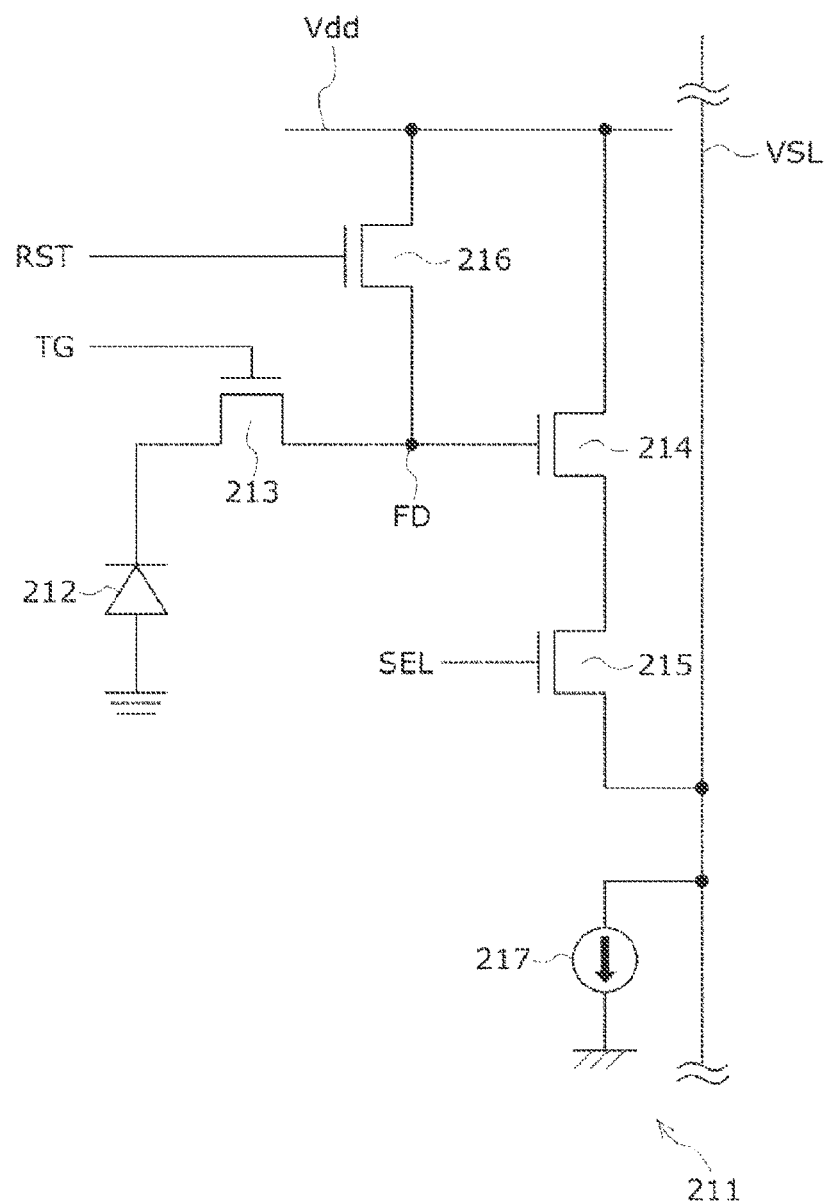
FIG. 13 is a circuit diagram illustrating an example of a configuration of a pixel disposed in a pixel part.

FIG. 13 illustrates an example of a detailed configuration of pixels 211 two-dimensionally arranged in the pixel part 210 of FIG. 12.

In FIG. 13, the pixel 211 has a photodiode 212 as a photoelectric conversion element, and has four pixel transistors of a transfer transistor 213, an amplification transistor 214, a selection transistor 215, and a reset transistor 216 with respect to the photodiode 212.

The photodiode 212 photoelectrically converts incident light into charges corresponding to the quantity of the light. The transfer transistor 213 is connected between the photodiode 212 and a floating diffusion FD, and transfers the charge photoelectrically converted by the photodiode 212 to the floating diffusion FD when a transfer control signal (TG) is applied to the gate of the transfer transistor 213.

The floating diffusion FD is connected with the gate of the amplification transistor 214. The amplification transistor 214 is connected to the vertical signal line VSL via the selection transistor 215 and constitutes a source follower along with a constant current source 217 outside the pixel part 210.

Then, when a selection control signal (SEL) is applied to the gate of the selection transistor 215, and the selection transistor 215 is turned on, the amplification transistor 214 amplifies the potential of the floating diffusion FD and outputs a voltage corresponding to the potential to the vertical signal line VSL. The signal voltage (analog signal) output from the pixel 211 is input to the AD converter 250 via the vertical signal line VSL.

Note that the reset transistor 216 is connected between the power supply line Vdd and the floating diffusion FD, and resets the potential of the floating diffusion FD to the potential of the power supply line Vdd when a reset control signal (RST) is applied to the gate of the reset transistor 216.

(Comparator Configuration)

Figure 14:
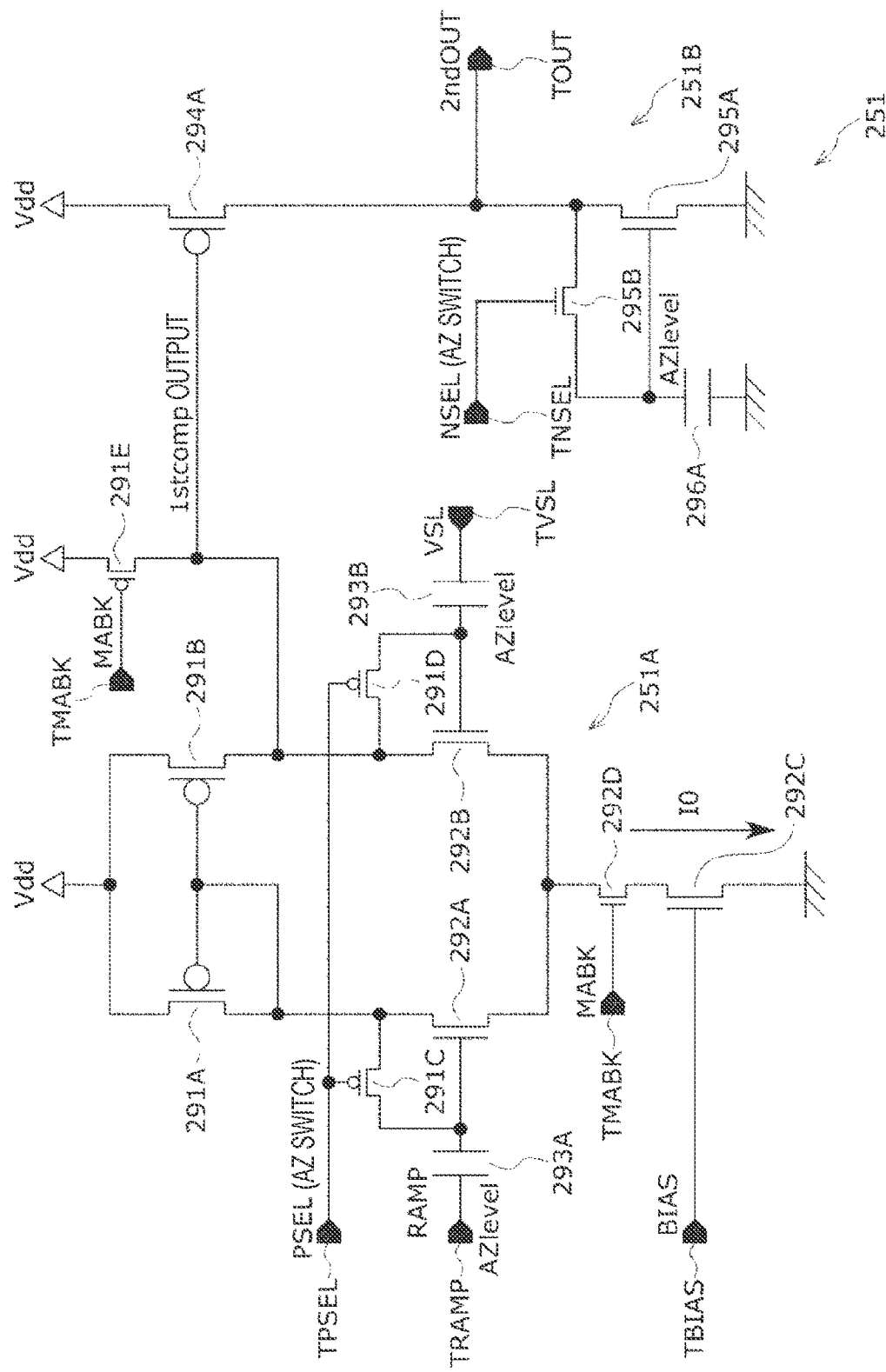
FIG. 14 is a circuit diagram illustrating an example of a configuration of a comparator in an AD conversion part.

FIG. 14 illustrates an example of a detailed configuration of the comparator 251 included in the AD converter 250 of FIG. 12.

In FIG. 14, in the comparator 251, a first amplifier 251A having a function of performing a low-speed signal comparison operation in the first stage to narrow an operation band and a second amplifier 251B having a function of increasing the gain of the output of the first amplifier 251A are cascade-connected.

Then, the comparator 251 is configured to independently control a first AZ (initialization) signal PSEL for the first amplifier 251A to be applied to an AZ switch configured to determine the operating point in each column at the start of the row operation in parallel by the intermittent operation basic unit in the horizontal direction (the arrangement direction of the comparators, the column direction), so that only the AZ switch of the non-operation comparator is fixed to off at the start of the non-operation line.

The first amplifier 251A has p-channel metal-oxide-semiconductor (PMOS) transistors 291A to 291E, N-channel metal-oxide-semiconductor (NMOS) transistors 292A to 292D, and capacitors 293A, 293B which are sampling capacitors at the AZ level.

In the first amplifier 251A having such a configuration, the PMOS transistors 291A, 291B constitute the current mirror circuit, and the NMOS transistors 292A, 292B constitute a differential comparison part using the NMOS transistor 292C as a current source.

Further, the PMOS transistors 291C, 291D function as the AZ switches, and the capacitors 293A, 293B function as the sampling capacitors at the AZ level. Here, as the capacitors 293A, 293B, a capacitor to which the present technology has been applied, that is, a capacitive element having a three-layer structure of an electrode, an oxide film, and silicide, can be used.

The second amplifier 251B has a PMOS transistor 294A, NMOS transistors 295A, 295B, and a capacitor 296A which is a sampling capacitor of the AZ level.

In the second amplifier 251B having such a configuration, the PMOS transistor 294A constitutes an input and a current source circuit.

Further, the NMOS transistor 295B functions as the AZ switch, and the capacitor 296A functions as the sampling capacitor at the AZ level. Here, as the capacitor 296A, a capacitor to which the present technology has been applied, that is, the capacitive element having the three-layer structure of the electrode, the oxide film, and the silicide, can be used.

As described above, in the solid-state imaging device 200, by using capacitive elements each having the three-layer structure (electrode, oxide film, silicide) to which the present technology has been applied (capacitive elements improved in the voltage dependency of the gate capacitance type) as the capacitors 293A, 293B, 296A, provided in the AD converter 250 (comparator 251), it is possible to reduce the nonlinear distortion in the ADC, and as a result, the image quality of a captured image can be improved.

(Other Configurations of Pixels)

Figure 15:
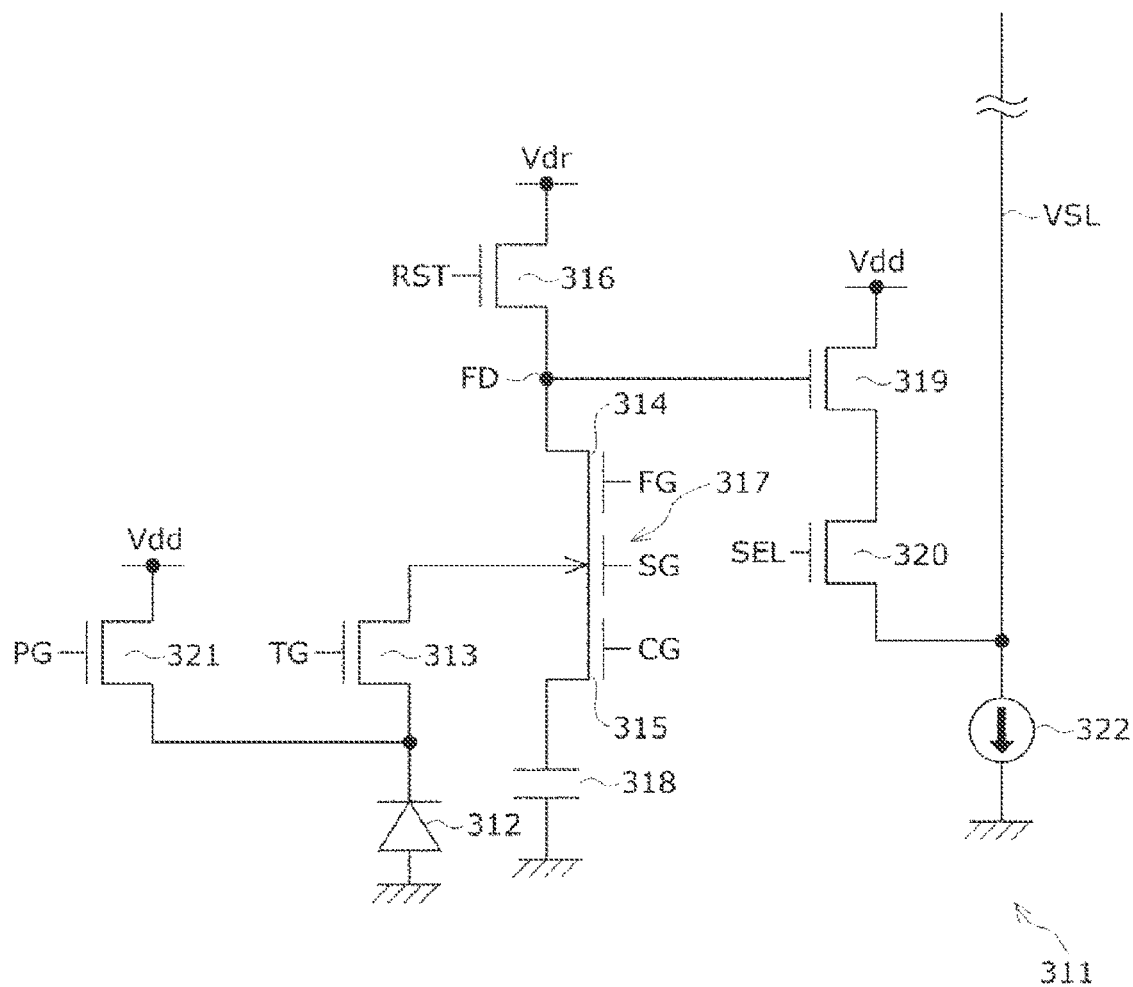
FIG. 15 is a circuit diagram illustrating an example of another configuration of the pixel disposed in the pixel part.

FIG. 15 illustrates an example of a detailed configuration of a pixel 311 as another configuration of the pixels arranged two-dimensionally in the pixel part 210 of FIG. 12.

In FIG. 15, the pixel 311 has a photodiode 312 and has a first transfer transistor 313, a second transfer gate part 314, a third transfer gate part 315, a reset transistor 316, a first charge storage part 317, a second charge storage part 318, an amplification transistor 319, a selection transistor 320, and a charge discharging transistor 321, with respect to the photodiode 312.

Here, in the pixel 311, in order to achieve a global shutter for performing the exposure start and the exposure end at the same timing for all pixels in the pixel part 210, a first charge storage part 317 and a second charge storage part 318 are provided as regions for accumulating charges, separately from the photodiode 312 as a photoelectric conversion element. For example, an embedded MOS capacitor can be used as the first charge storage part 317, and a MOS capacitor having a capacitance value per unit area larger than that of the first charge storage part 317 can be used as the second charge storage part 318.

The photodiode 312 photoelectrically converts incident light into charges corresponding to the quantity of the light. The first transfer transistor 313 is connected between the photodiode 312 and the first charge storage part 317 and transfers the charge, photoelectrically converted in the photodiode 312, to the first charge storage part 317 when a transfer control signal (TG) is applied to the gate of the first transfer transistor 313. The first charge storage part 317 temporarily stores the charge transferred from the first transfer transistor 313.

The second transfer gate part 314 is connected to the first charge storage part 317 and the floating diffusion FD, and transfers the charge stored in the first charge storage part 317 to the floating diffusion FD when a transfer control signal (FG) is applied to the gate of the second transfer gate part 314. The third transfer gate part 315 is connected between the first charge storage part 317 and the second charge storage part 318, and couples the potentials of the first charge storage part 317 and the second charge storage part 318 when a transfer control signal (CG) is applied to the gate of the third transfer gate part 315.

The reset transistor 316 is connected between a power supply line Vdr and the floating diffusion FD, and resets the potential of the floating diffusion FD to the potential of the power supply line Vdr when a reset control signal (RST) is applied to the gate of the reset transistor 316.

The amplification transistor 319 has a gate connected to the floating diffusion FD. The amplification transistor 319 is connected to the vertical signal line VSL via the selection transistor 320 and constitutes a source follower along with a constant current source 322 outside the pixel part 210 (FIG. 12).

Then, when a selection control signal (SEL) is applied to the gate of the selection transistor 320, and the selection transistor 320 is turned on, the amplification transistor 319 amplifies the potential of the floating diffusion FD and outputs a voltage corresponding to the potential to the AD converter 250 (FIG. 12) via the vertical signal line VSL.

Note that the charge discharging transistor 321 is connected between the photodiode 312 and the power supply line Vdd (charge discharging part), and selectively discharges the charge stored in the photodiode 312 when a charge discharging control signal (PG) is applied to the gate of the charge discharging transistor 321.

Figure 16:
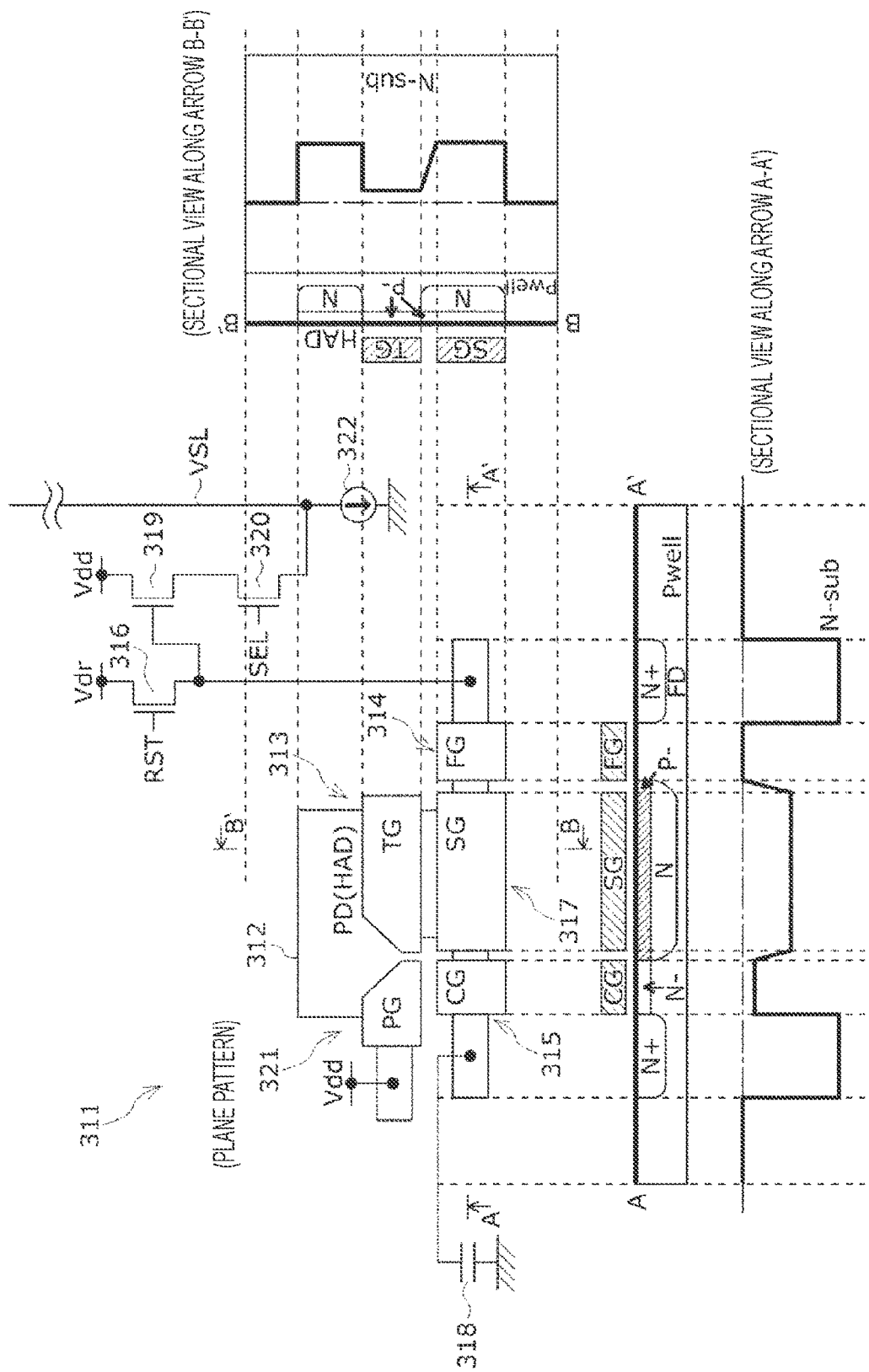
FIG. 16 is a sectional view illustrating the example of another configuration of the pixel disposed in the pixel part.

Further, FIG. 16 is a schematic diagram illustrating the structure of the pixel 311, and the same reference numerals are given to a portion corresponding to FIG. 15. Note that FIG. 16 illustrates a plane pattern showing a pixel layout, and a sectional view taken along an arrow A-A' and a sectional view taken along an arrow B-B' in the plane pattern, respectively.

In the pixel 311 configured as described above, the capacitor to which the present technology has been applied, that is, the capacitive element having the three-layer structure of the electrode, the oxide film, and the silicide (the capacitive element having improved the voltage dependency of the gate capacitance type), can be used as a capacitor constituting the second charge storage part 318.

Note that in the solid-state imaging device 200, the pixel part 210 and the peripheral circuit part including the AD converter 250 and the like may be formed on the same substrate or may be formed on different substrates. That is, in the solid-state imaging device 200 (e.g., a back-illuminated CMOS image sensor, etc.), by using a structure in which a plurality of semiconductor layers is laminated, for example, a structure can be used in which the pixel part 210 is formed in the first semiconductor layer and the peripheral circuit part including the AD converter 250 and the like is formed in the second semiconductor layer.

3. Example of Application to Electronic Equipment

The solid-state imaging device 200 (FIG. 12) described above can be applied to various kinds of electronic equipment being, for example, imaging devices such as a digital still camera and a digital video camera, a mobile phone and a smartphone having an imaging function, and other equipment having an imaging function.

(Configuration of Electronic Equipment)

Figure 17:
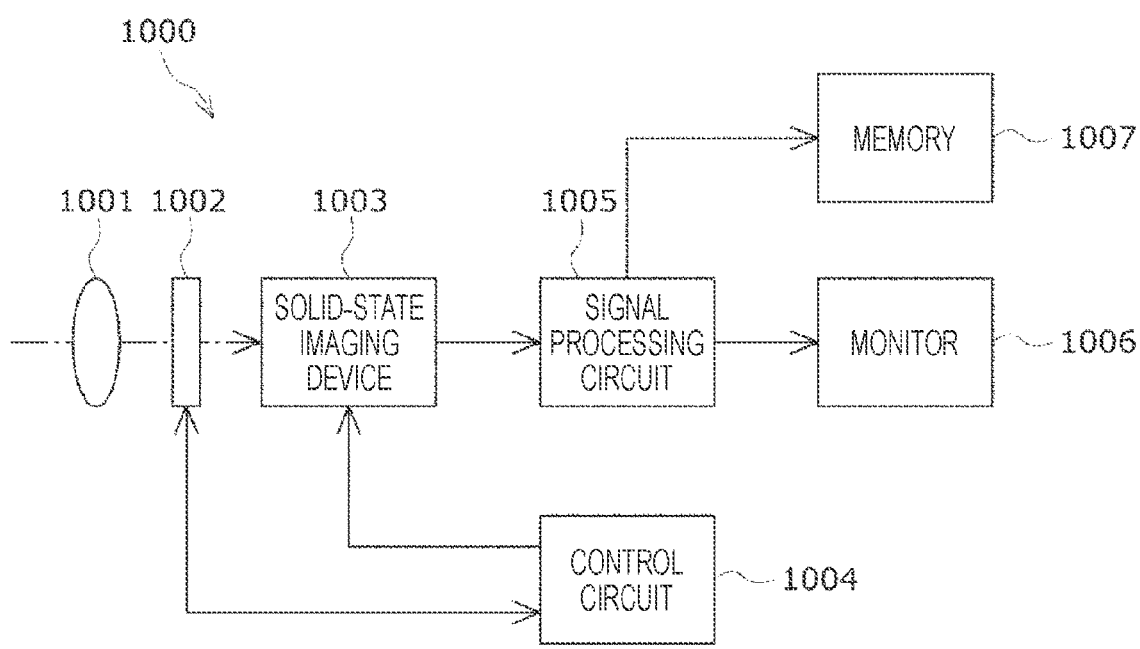
FIG. 17 is a block diagram illustrating an example of a configuration of electronic equipment equipped with a solid-state imaging device to which the technology according to the present disclosure has been applied.

FIG. 17 is a block diagram illustrating an example of a configuration of electronic equipment equipped with the solid-state imaging device to which the technology according to the present disclosure has been applied.

In FIG. 17, electronic equipment 1000 includes an optical system 1001, a shutter device 1002, a solid-state imaging device 1003, a control circuit 1004, a signal processing circuit 1005, a monitor 1006, and a memory 1007 and can capture a still image or a moving image.

The optical system 1001 is configured having one or more lenses, guides light (incident light) from a subject to the solid-state imaging device 1003, and forms the light as an image on the light-receiving surface of the solid-state imaging device 1003.

The shutter device 1002 is disposed between the optical system 1001 and the solid-state imaging device 1003 and controls a light irradiation period and a shielding period for the solid-state imaging device 1003 in accordance with the control from the control circuit 1004.

The solid-state imaging device 1003 is configured as a package including, for example, the solid-state imaging device 200 (FIG. 12) described above. The solid-state imaging device 1003, under the control of the control circuit 1004, accumulates charges corresponding to the light formed as the image on the light-receiving surface via the optical system 1001 and the shutter device 1002, reads the charges at a predetermined timing, and performs AD conversion and predetermined signal processing to generate an image signal and supply the image signal to the signal processing circuit 1005.

The control circuit 1004 generates a drive signal for controlling the shutter operation of the shutter device 1002 and the transfer operation of the solid-state imaging device 1003 to drive the shutter device 1002 and the solid-state imaging device 1003.

The signal processing circuit 1005 is configured as, for example, a camera image signal processor (ISP) or the like. The signal processing circuit 1005 performs various types of signal processing such as, for example, demosaicing, color space conversion, resolution conversion, and codec by using an image signal output from the solid-state imaging device 1003. The signal processing circuit 1005 supplies the image data (of the captured image) obtained by the signal processing to the monitor 1006 or the memory 1007.

The monitor 1006 includes, for example, a display device such as a liquid crystal display or an organic light-emitting diode (OLED) display. The monitor 1006 displays an image corresponding to the image data supplied from the signal processing circuit 1005.

The memory 1007 includes a storage device such as a semiconductor memory, for example. The memory 1007 stores the image data supplied from the signal processing circuit 1005.

In the electronic equipment 1000 configured as described above, by including the solid-state imaging device 200 (FIG. 12) as the solid-state imaging device 1003, for example, the capacitive element of the three-layer structure (electrode, oxide film, silicide) to which the present technology has been applied (the capacitive element having improved the voltage dependency of the gate capacitance type) is used as a capacitor provided in the AD converter 250 (comparator 251) or the pixel part 210 (pixel 311) corresponding to the global shutter. Therefore, the nonlinear distortion in the ADC can be reduced, and as a result, the image quality of the captured image can be improved.

4. Example of Application to Endoscopic Surgical System

The technology according to the present disclosure (present technology) can be applied to various products. For example, the technology according to the present disclosure may be applied to an endoscopic surgical system.

Figure 18:
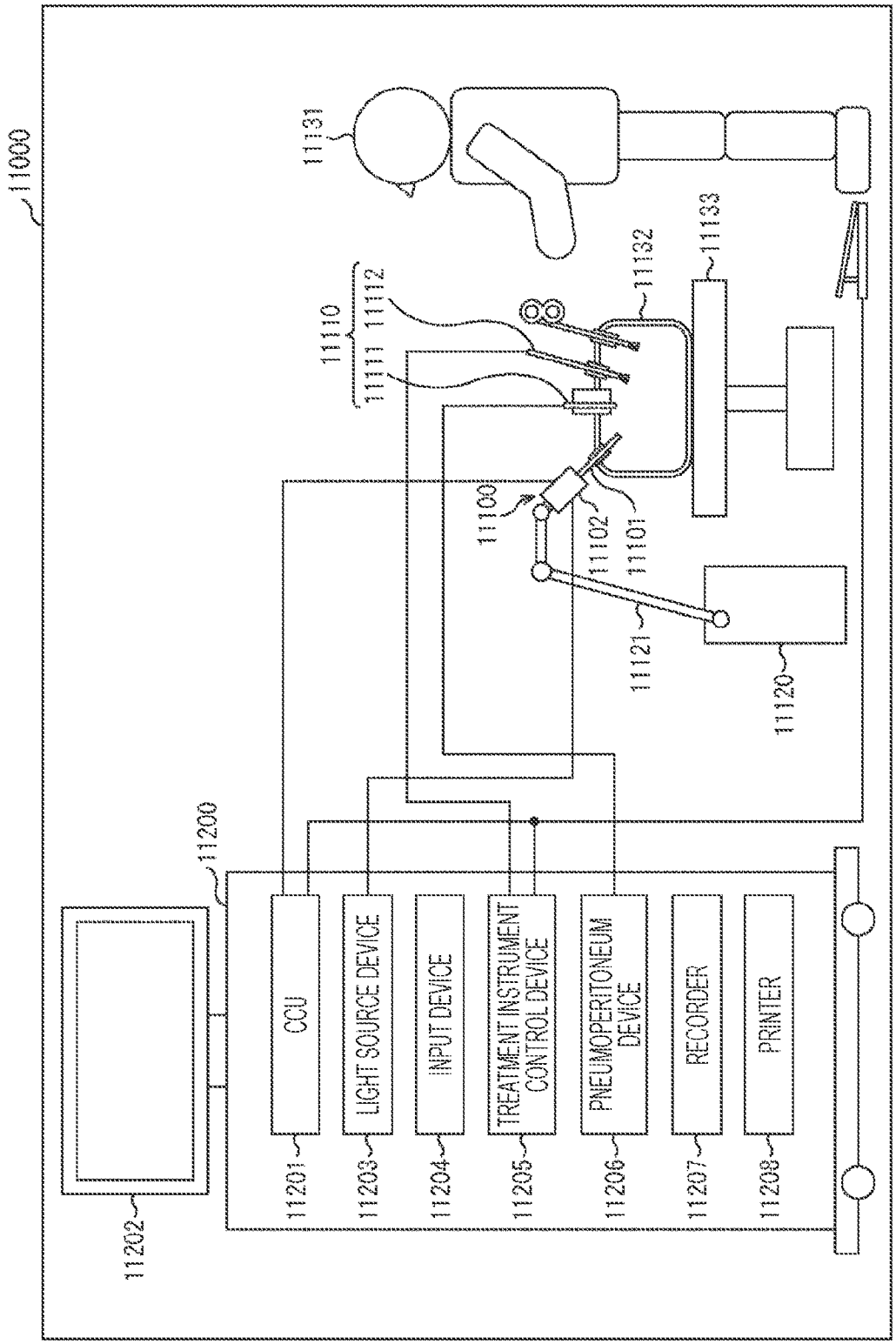
FIG. 18 illustrates an example of a schematic configuration of an endoscopic surgical system.

FIG. 18 is a diagram illustrating an example of a schematic configuration of an endoscopic surgical system to which the technology according to the present disclosure (present technology) can be applied.

FIG. 18 illustrates a situation where an operator (doctor) 11131 is performing an operation on a patient 11132 on a patient bed 11133 by using an endoscopic surgical system 11000. As illustrated, the endoscopic surgical system 11000 includes an endoscope 11100, other surgical tools 11110, such as a pneumoperitoneum tube 11111 and an energy treatment tool 11112, a support arm device 11120 for supporting the endoscope 11100, and a cart 11200 on which various devices for endoscopic surgery are mounted.

The endoscope 11100 includes a lens barrel 11101 having a region, with a predetermined length from the tip, inserted into the body cavity of the patient 11132, and a camera head 11102 connected to the base end of the lens barrel 11101. Although the illustrated example illustrates the endoscope 11100 configured as a so-called rigid mirror having a rigid lens barrel 11101, the endoscope 11100 may be configured as a so-called flexible mirror having a flexible lens barrel.

An opening in which an objective lens is fitted is provided at the tip of the lens barrel 11101. A light source device 11203 is connected to the endoscope 11100, and light generated by the light source device 11203 is guided to the tip of the lens barrel by a light guide extended inside the lens barrel 11101, and an observation object in the body cavity of the patient 11132 is irradiated with the light via an objective lens. Note that the endoscope 11100 may be a forward-viewing endoscope, an oblique-viewing endoscope, or a side-viewing endoscope.

An optical system and an imaging element are provided inside the camera head 11102, and reflected light (observation light) from an observation object is condensed on the imaging element by the optical system. The imaging element photoelectrically converts the observation light to generate an electric signal corresponding to the observation light, that is, an image signal corresponding to the observation image. The image signal is transmitted as RAW data to a camera control unit (CCU) 11201.

The CCU 11201 includes a central processing unit (CPU), a graphics processing unit (GPU), or the like and collectively controls the operations of the endoscope 11100 and a display device 11202. Moreover, the CCU 11201 receives an image signal from the camera head 11102 and performs various kinds of image processing for displaying an image based on the image signal such as, for example, development processing (demosaicing processing) on the image signal.

The display device 11202 displays an image based on an image signal subjected to image processing by the CCU 11201, under control from the CCU 11201.

The light source device 11203 includes a light source such as, for example, a light-emitting diode (LED) and supplies the endoscope 11100 with irradiation light at the time of capturing an image of an operation site or the like.

An input device 11204 is an input interface to the endoscopic surgical system 11000. The user can input various kinds of information and input instructions to the endoscopic surgical system 11000 via the input device 11204. For example, the user inputs an instruction or the like to change conditions (type of irradiation light, magnification, focal length, etc.) for the imaging by the endoscope 11100.

A treatment instrument control device 11205 controls the drive of the energy treatment tool 11112 configured to cauterize the tissue, incising the tissue, sealing the blood vessel, and the like. A pneumoperitoneum device 11206 sends gas via the pneumoperitoneum tube 11111 to inflate the body cavity of the patient 11132 for the purpose of ensuring the field of view by the endoscope 11100 and ensuring the working space of the operator. A recorder 11207 is a device capable of recording various kinds of information regarding the operation. The printer 11208 is a device capable of printing various kinds of information regarding surgery in various forms such as text, images, or graphs.

Note that the light source device 11203 for supplying the endoscope 11100 with the irradiation light at the time of capturing the image of the operation site can include, for example, an LED, a laser light source, or a white light source constituted by a combination of these. In a case where the white light source is constituted by a combination of RGB laser light sources, the output intensity and the output timing of each color (each wavelength) can be controlled with high accuracy, so that the white balance of the captured image can be adjusted in the light source device 11203. Further, in this case, the observation object is irradiated with the laser beams from the respective RGB laser light sources in time division, and the driving of the imaging element of the camera head 11102 is controlled in synchronization with the irradiation timing, whereby the images respectively corresponding to RGB can be captured in time division. According to the method, a color image can be obtained without providing a color filter in the imaging element.

Further, the driving of the light source device 11203 may be controlled so as to change the intensity of light to be output every predetermined time. The driving of the imaging element of the camera head 11102 is controlled in synchronism with the timing of the change in the intensity of the light to acquire an image in time division, and the image is synthesized, thereby enabling the generation of an image in a high dynamic range free from so-called clipped black or clipped white.

Moreover, the light source device 11203 may be configured to supply light of a predetermined wavelength band corresponding to special light observation. In the special light observation, for example, so-called narrow-band optical observation (narrow-band imaging) is performed in which the wavelength dependency of light absorption in the body tissue is used to perform irradiation with light in a narrower band than the irradiation light (i.e., white light) in normal observation, thereby capturing an image of a predetermined tissue, such as a blood vessel on the mucosal surface layer, in high contrast. Alternatively, in the special light observation, fluorescence observation may be performed for obtaining an image by fluorescence generated by performing irradiation with excitation light. In the fluorescence observation, it is possible to, for example, observe fluorescence from a body tissue by irradiating the body tissue with excitation light (auto-fluorescence observation), or to obtain a fluorescence image by locally injecting a reagent such as indocyanine green (ICG) into the body tissue and irradiating the body tissue with excitation light corresponding to the fluorescence wavelength of the reagent. The light source device 11203 can be configured to supply narrow-band light and/or excitation light corresponding to such special light observation.

Figure 19:
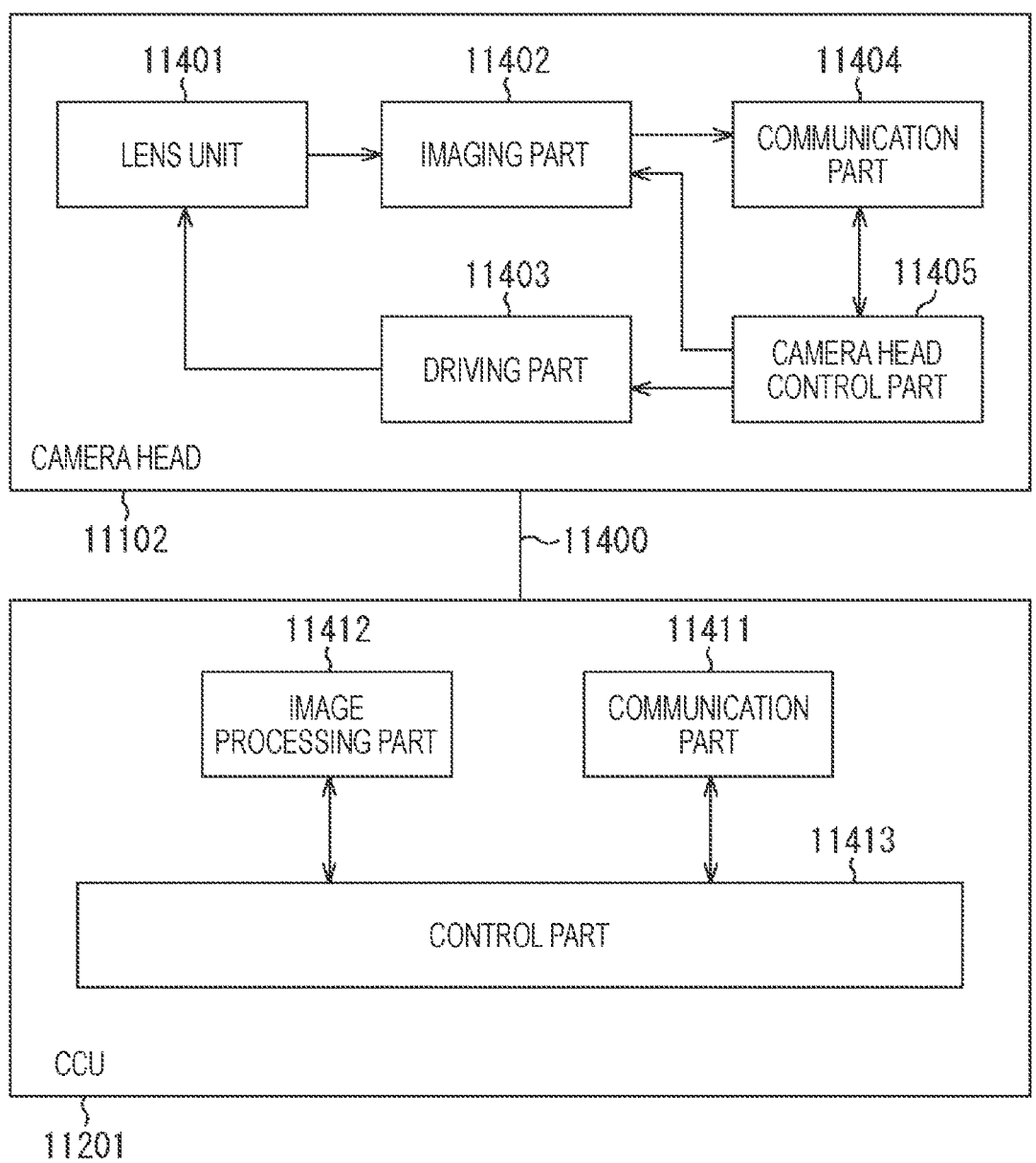
FIG. 19 is a block diagram illustrating an example of a functional configuration of a camera head and a camera control unit (CCU).

FIG. 19 is a block diagram illustrating an example of the functional configuration of the camera head 11102 and the CCU 11201 illustrated in FIG. 18.

The camera head 11102 has a lens unit 11401, an imaging part 11402, a driving part 11403, a communication part 11404, and a camera head control part 11405. The CCU 11201 has a communication part 11411, an image processing part 11412, and a control part 11413. The camera head 11102 and the CCU 11201 are communicatively connected to each other by a transmission cable 11400.

The lens unit 11401 is an optical system provided in a connection part with the lens barrel 11101. The observation light taken in from the tip of the lens barrel 11101 is guided to the camera head 11102 and made incident on the lens unit 11401. The lens unit 11401 is constituted by a combination of a plurality of lenses including a zoom lens and a focus lens.

The imaging part 11402 includes an imaging element. The number of imaging elements constituting the imaging part 11402 may be one (so-called single-plate type) or two or more (so-called multi-plate type). In a case where the imaging part 11402 includes a multi-plate type, for example, image signals respectively corresponding to RGB may be generated by the respective imaging elements, and the image signals may be synthesized to obtain a color image. Alternatively, the imaging part 11402 may be configured to have a pair of imaging elements for acquiring image signals for the right eye and left eye corresponding to three-dimensional (3D) display, respectively. By the 3D display being performed, the operator 11131 can more accurately grasp the depth of the biological tissue in the operation site. Note that in the case where the imaging part 11402 includes a multi-plate type, a plurality of lens units 11401 can be provided corresponding to the respective imaging elements.

In addition, the imaging part 11402 may not necessarily be provided in the camera head 11102. For example, the imaging part 11402 may be provided inside the lens barrel 11101 immediately behind the objective lens.

The driving part 11403 includes an actuator and moves the zoom lens and the focus lens of the lens unit 11401 by a predetermined distance along the optical axis by control from the camera head control part 11405. Thus, the magnification and the focus of the image captured by the imaging part 11402 can be adjusted appropriately.

The communication part 11404 includes a communication device for transmitting and receiving various kinds of information to and from the CCU 11201. The communication part 11404 transmits the image signal, obtained from the imaging part 11402, as RAW data to the CCU 11201 via the transmission cable 11400.

Further, the communication part 11404 receives a control signal for controlling the driving of the camera head 11102 from the CCU 11201 and supplies the signal to the camera head control part 11405. The control signal includes information regarding imaging conditions such as, for example, information specifying the frame rate of the captured image, information specifying an exposure value at the time of imaging, and/or information specifying the magnification and focus of the captured image.

Note that the imaging conditions such as the frame rate, exposure value, magnification, and focus described above may be appropriately designated by the user or may be automatically set by the control part 11413 of the CCU 11201 on the basis of the acquired image signal. In the latter case, what are called an auto exposure (AE) function, an auto focus (AF) function, and an auto white balance (AWB) function are mounted on the endoscope 11100.

The camera head control part 11405 controls the driving of the camera head 11102 on the basis of a control signal from the CCU 11201 received via the communication part 11404.

The communication part 11411 includes a communication device for transmitting and receiving various kinds of information to and from the camera head 11102. The communication part 11411 receives an image signal transmitted from a camera head 11102 via the transmission cable 11400.

Further, the communication part 11411 transmits a control signal for controlling the driving of the camera head 11102 to the camera head 11102. The image signal and the control signal can be transmitted by electric communication, optical communication, or the like.

The image processing part 11412 performs various kinds of image processing on an image signal being RAW data transmitted from the camera head 11102.

The control part 11413 performs various kinds of control regarding the imaging of an operation site or the like by the endoscope 11100 and the display of a captured image obtained by the imaging of the operation site or the like. For example, the control part 11413 generates a control signal for controlling the driving of the camera head 11102.

Further, the control part 11413 causes the display device 11202 to display a captured image on which the operation site or the like is captured, on the basis of the image signal subjected to image processing by the image processing part 11412. In this case, the control part 11413 may recognize various objects in the captured image by using various image recognition technologies. For example, the control part 11413 can detect the shape, color, and the like of the edge of an object included in the captured image to recognize an operation tool such as a forceps, a specific biological portion, hemorrhage, mist when the energy treatment tool 11112 is used, and the like. At the time of the display device 11202 displaying the captured image, the control part 11413 may cause various kinds of operation support information to be superimposed and displayed on the image of the operation site by using the recognition result of the display. The operation support information is superimposed and displayed to be presented to the operator 11131, so that the burden on the operator 11131 can be reduced, and the operator 11131 can surely proceed with the operation.

The transmission cable 11400 connecting the camera head 11102 and the CCU 11201 is an electric signal cable corresponding to the communication of an electric signal, an optical fiber corresponding to optical communication, or a composite cable of these.

Here, in the illustrated example, the communication has been performed by wire using the transmission cable 11400, but the communication between the camera head 11102 and the CCU 11201 may be performed wirelessly.

An example of the endoscopic surgical system to which the technology according to the present disclosure can be applied has been described above. The technology according to the present disclosure can be applied to the endoscope 11100 and (the imaging part 11402 of) the camera head 11102 among the configurations described above. Specifically, the solid-state imaging device 200 of FIG. 12 can be applied to the imaging part 11402, for example. By applying the technology according to the present disclosure to the imaging part 11402, for example, the nonlinear distortion in the ADC can be reduced to obtain a clearer image of the operation site, so that the operator can more reliably confirm the operation site.

Note that, although the endoscopic surgical system has been described here as an example, the technology according to the present disclosure may be applied to other systems such as, for example, a microscopic surgery system.

5. Application Example to Moving Object

The technology according to the present disclosure (present technology) can be applied to various products. For example, the technology according to the present disclosure may be implemented as a device mounted on any type of moving object, such as an automobile, an electric vehicle, a hybrid electric vehicle, a motorcycle, a bicycle, a personal transporter, an airplane, a drone, a ship, or a robot.

Figure 20:
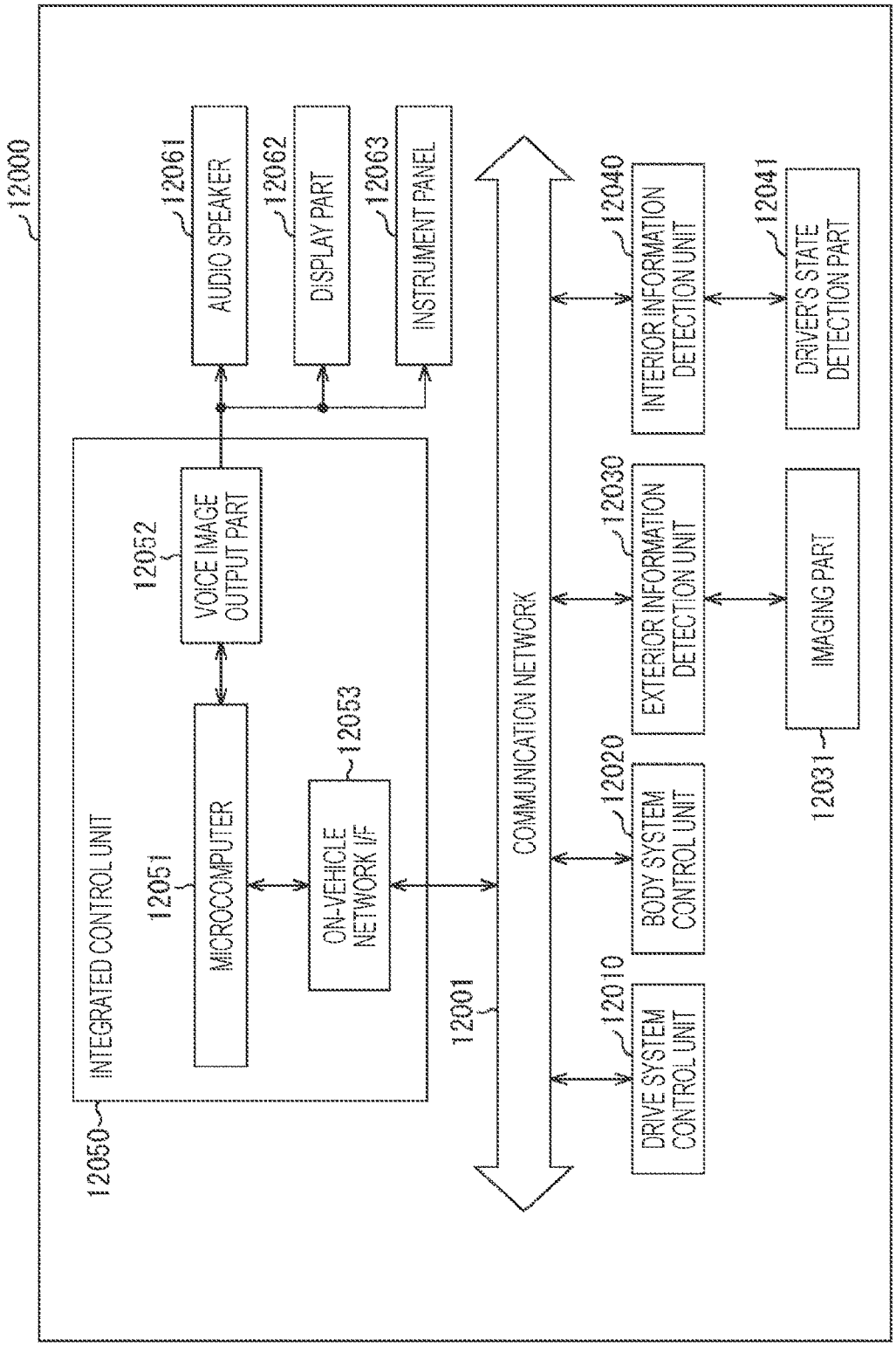
FIG. 20 is a block diagram illustrating an example of a schematic configuration of a vehicle control system.

FIG. 20 is a block diagram illustrating a schematic configuration example of a vehicle control system that is an example of a moving object control system to which the technology according to the present disclosure can be applied.

The vehicle control system 12000 includes a plurality of electronic control units connected via a communication network 12001. In the example illustrated in FIG. 20, the vehicle control system 12000 includes a drive system control unit 12010, a body system control unit 12020, an exterior information detection unit 12030, an interior information detection unit 12040, and an integrated control unit 12050. Moreover, as the functional configurations of the integrated control unit 12050, a microcomputer 12051, a voice image output part 12052, and an on-vehicle network interface (I/F) 12053 are illustrated.

The drive system control unit 12010 controls the operation of the device related to the drive system of the vehicle in accordance with various programs. For example, the drive system control unit 12010 functions as control devices for a drive force generation device for generating the drive force of the vehicle, such as an internal combustion engine or a drive motor, a drive force transmission mechanism for transmitting the drive force to wheels, a steering mechanism for adjusting the steering angle of the vehicle, a braking device for generating the braking force of the vehicle, and the like.

The body system control unit 12020 controls the operations of various devices mounted on the vehicle body in accordance with various programs. For example, the body system control unit 12020 functions as a control device for a keyless entry system, a smart key system, a power window device, or various lamps such as a headlamp, a back lamp, a brake lamp, a blinker, or a fog lamp. In this case, the body system control unit 12020 can receive the input of radio waves or various switch signals transmitted from a portable device that replaces a key. The body system control unit 12020 receives the input of these radio waves or signals and controls a door lock device, a power window device, a lamp, and the like of the vehicle.

The exterior information detection unit 12030 detects information on the outside of a vehicle mounted with a vehicle control system 12000. For example, the exterior information detection unit 12030 is connected to an imaging part 12031. The exterior information detection unit 12030 causes the imaging part 12031 to capture an outside image and receives the captured image. The exterior information detection unit 12030 may perform detection processing or distance detection processing for an object such as a person, a vehicle, an obstacle, a sign, or characters on a road surface, on the basis of the received image.

The imaging part 12031 is an optical sensor that receives light and outputs an electric signal in accordance with the quantity of the light received. The imaging part 12031 can output an electric signal as an image or can output the signal as distance measurement information. In addition, the light received by the imaging part 12031 may be visible light or non-visible light such as infrared light.

The interior information detection unit 12040 detects information on the inside of the vehicle. The interior information detection unit 12040 is connected with, for example, a driver's state detection part 12041 for detecting the state of a driver. The driver's state detection part 12041 includes, for example, a camera for capturing an image of the driver, and the interior information detection unit 12040 may calculate the degree of fatigue or the degree of concentration of the driver or may determine whether the driver is not dozing on the basis of the detection information input from the driver's state detection part 12041.

The microcomputer 12051 calculates a control target value of the drive force generation device, the steering mechanism, or the braking device on the basis of the information on the inside and outside of the vehicle acquired by the exterior information detection unit 12030 or the interior information detection unit 12040 and can output a control command to the drive system control unit 12010. For example, the microcomputer 12051 can perform cooperative control for the purpose of achieving functions of an advanced driver assistance system (ADAS), including collision avoidance or impact reduction of a vehicle, following travel based on a distance between vehicles, vehicle speed keeping travel, a warning of vehicle collision, a warning of lane departure of a vehicle, and the like.

Further, the microcomputer 12051 controls the drive force generation device, the steering mechanism, the braking device, and the like on the basis of information on the surroundings of the vehicle acquired by the exterior information detection unit 12030 or the interior information detection unit 12040 and can thereby perform cooperative control for the purpose of automatic driving, which is to autonomously travel without depending on the operation of the driver, or the like.

Moreover, the microcomputer 12051 can output a control command to the body system control unit 12020 on the basis of the information on the outside of the vehicle acquired by the exterior information detection unit 12030. For example, the microcomputer 12051 controls the headlamp in accordance with the position of the preceding vehicle or the oncoming vehicle detected by the exterior information detection unit 12030 and can perform cooperative control for the purpose of anti-glare such as switching of the high beam to the low beam.

The voice image output part 12052 transmits an output signal of at least one of a voice or an image to an output device capable of visually or aurally notifying a person on board the vehicle or the outside of the vehicle with information. In the example of FIG. 20, an audio speaker 12061, a display part 12062, and an instrument panel 12063 are illustrated as output devices. The display part 12062 may include, for example, at least one of an onboard display and a head-up display.

Figure 21:
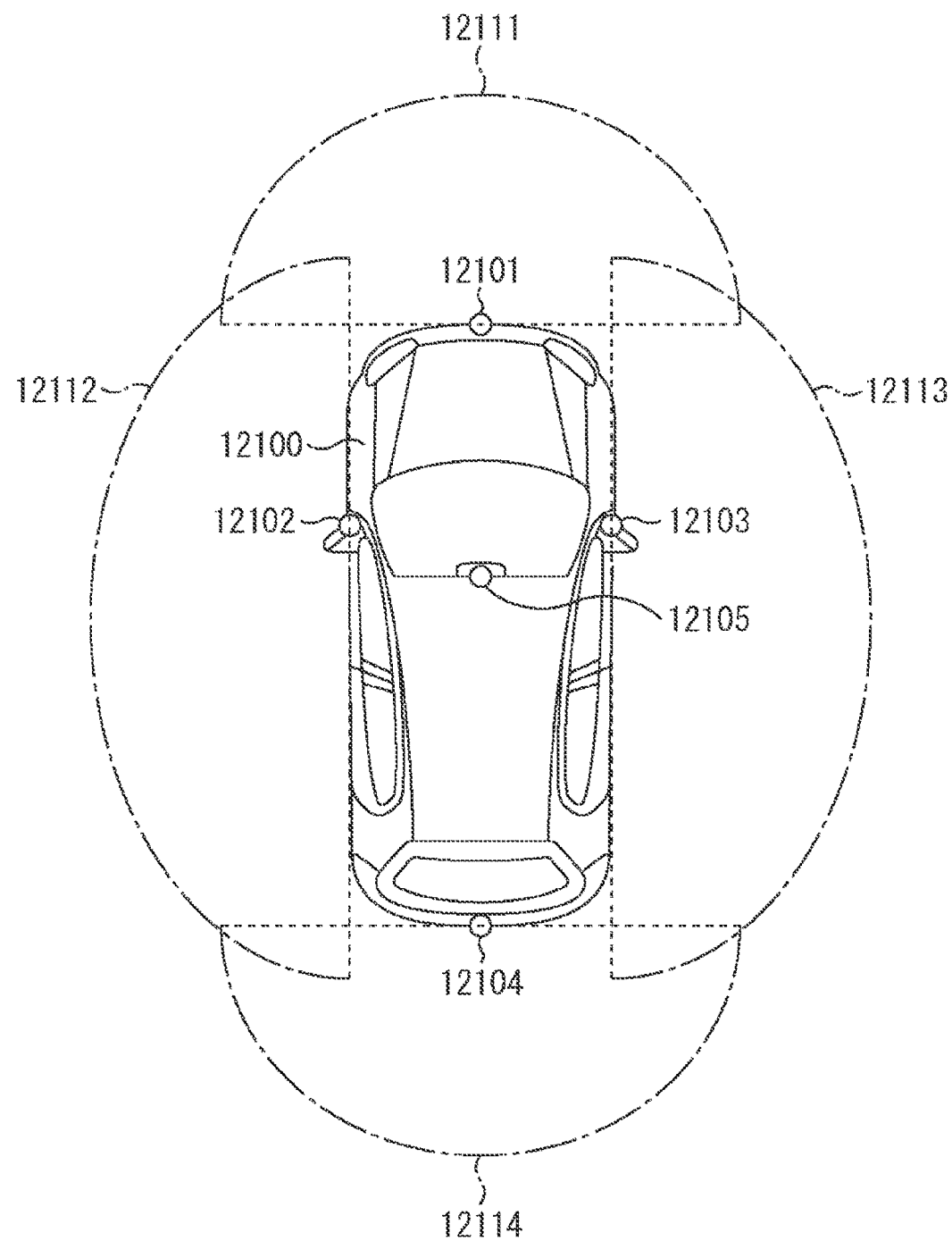
FIG. 21 is an explanatory view illustrating an example of installation positions of an exterior information detection unit and an imaging part.

FIG. 21 is a view illustrating an example of the installation position of the imaging part 12031.

In FIG. 21, the imaging part 12031 includes imaging parts 12101, 12102, 12103, 12104, 12105.

The imaging parts 12101, 12102, 12103, 12104, 12105 are provided at positions such as, for example, a front nose, a side mirror, a rear bumper, a back door, and an upper portion of a windshield in a cabin of the vehicle 12100. The imaging part 12101 provided on the front nose and the imaging part 12105 provided on the upper portion of the windshield in the cabin mainly acquire images in front of a vehicle 12100. The imaging parts 12102, 12103 provided on the side mirrors mainly acquire images on the side of the vehicle 12100. The imaging part 12104 provided on the rear bumper or the back door mainly acquires images behind the vehicle 12100. The imaging part 12105 provided on the upper portion of the windshield in the cabin is mainly used for detecting a preceding vehicle, a pedestrian, an obstacle, a traffic signal, a traffic sign, a lane, and the like.

Note that FIG. 21 illustrates an example of the imaging range of the imaging parts 12101 to 12104. An imaging range 12111 indicates the imaging range of the imaging part 12101 provided on the front nose, imaging ranges 12112, 12113 indicate the imaging ranges of the imaging parts 12102, 12103 provided on the side mirrors, respectively, and an imaging range 12114 indicates the imaging range of the imaging part 12104 provided on the rear bumper or the back door. For example, pieces of image data captured by the imaging parts 12101 to 12104 are superimposed to obtain an overhead view image of the vehicle 12100 viewed from above.

At least one of the imaging parts 12101 to 12104 may have a function of acquiring distance information. For example, at least one of the imaging parts 12101 to 12104 may be a stereo camera including a plurality of imaging elements or may be an imaging element having pixels for phase difference detection.

For example, the microcomputer 12051 obtains, on the basis of the distance information obtained from each of the imaging parts 12101 to 12104, the distance to each three-dimensional object in each of the imaging range 12111 to 12114 and a temporal change in the distance (relative speed to the vehicle 12100) and can thereby extract, as a preceding vehicle, particularly the closest three-dimensional object on the traveling path of the vehicle 12100 as well as a three-dimensional object that travels at a predetermined speed (e.g., 0 km/h) in the substantially same direction as the vehicle 12100. Furthermore, the microcomputer 12051 sets an inter-vehicle distance to be ensured in front of the preceding vehicle and can perform automatic brake control (including following stop control), automatic acceleration control (including following start control), and the like. As thus described, it is possible to perform cooperative control for the purpose of automatic driving, which is to autonomously travel without depending on the operation of the driver, or the like.

For example, the microcomputer 12051 classifies pieces of three-dimensional object data relating to three-dimensional object into other three-dimensional objects such as two-wheeled vehicles, ordinary vehicles, large-sized vehicles, pedestrians, and utility poles on the basis of the pieces of distance information obtained from the imaging parts 12101 to 12104, extracts the three-dimensional object data, and can use the data for automatic avoidance of obstacles. For example, the microcomputer 12051 identifies obstacles around the vehicle 12100 as obstacles visible to the driver of the vehicle 12100 and obstacles difficult to view. Then, the microcomputer 12051 determines the collision risk indicating the degree of risk of collision with each obstacle, and when the collision risk is equal to or greater than a set value and there is a possibility of collision, the microcomputer 12051 outputs an alarm to the driver via the audio speaker 12061 or the display part 12062 or performs forced deceleration or avoidance steering via the drive system control unit 12010 and can thereby provide driving support for collision avoidance.

At least one of the imaging parts 12101 to 12104 may be an infrared camera for detecting infrared rays. For example, the microcomputer 12051 can recognize a pedestrian by determining whether or not the pedestrian is present in the captured images of the imaging parts 12101 to 12104. The pedestrian is recognized by, for example, a procedure for extracting feature points in the captured images of the imaging parts 12101 to 12104 serving as infrared cameras and a procedure for determining whether or not the object is a pedestrian by performing pattern matching processing on a series of feature points indicating the outline of the object. When the microcomputer 12051 determines that a pedestrian is present in the captured images of the imaging parts 12101 to 12104 and recognizes the pedestrian, the voice image output part 12052 controls the display part 12062 so as to superimpose and display a rectangular contour line for emphasis on the recognized pedestrian. Further, the voice image output part 12052 may control the display part 12062 so as to display an icon or the like indicating a pedestrian at a desired position.

An example of the vehicle control system to which the technology according to the present disclosure can be applied has been described above. The technology according to the present disclosure can be applied to (the imaging part 12101 or the like of) the imaging part 12031 among the configurations described above. Specifically, the solid-state imaging device 200 of FIG. 12 can be applied to the imaging part 12031, for example. By applying the technology according to the present disclosure to the imaging part 12031, for example, the linear distortion in the ADC can be reduced to obtain a clearer captured image, so that an object such as a person, a car, an obstacle, a sign, or a character on a road surface can be recognized more accurately, for example.

Note that the embodiment of the present technology is not limited to the embodiment described above, and various changes can be made without departing from the gist of the technology according to the present disclosure.

Further, the technology according to the present disclosure may have the following configurations:

(1) A semiconductor device having a laminated structure in which
a compound layer formed on a surface of a semiconductor layer and formed by the semiconductor layer reacting with metal,
an insulating film layer in contact with the compound layer, and
an electrode layer formed on the insulating film layer are laminated.

(2) The semiconductor device according to (1) above in which
the insulating film layer includes a silicon oxide film ($SiO_2$), and
the compound layer includes a silicide layer using metal silicide.

(3) The semiconductor device according to (2) above in which
the silicide layer contains at least one or more metals of titanium (Ti), cobalt (Co), and nickel (Ni).

(4) The semiconductor device according to (3) above in which
the silicide layer includes regions having different concentrations.

(5) The semiconductor device according to (4) above in which
the electrode layer is configured as a gate electrode, and
the silicide layer has different concentrations in right and left regions relative to the gate electrode.

(6) The semiconductor device according to any one of (1) to (5) above in which
the electrode layer is configured as a gate electrode, and
the laminated structure is configured as a part of a structure corresponding to a field-effect transistor.

(7) The semiconductor device according to (6) above in which
the structure includes a planar structure, a trench-gate structure, or a fin structure.

(8) A solid-state imaging device including:
a pixel part in which pixels each having a photoelectric conversion part are arranged two-dimensionally; and
an analog-to-digital (AD) conversion part that converts analog signals from a plurality of the pixels into digital signals,
the solid-state imaging device having a laminated structure in which
a plurality of the pixels and the AD conversion part are formed on a semiconductor layer, and
a compound layer formed on a surface of the semiconductor layer and formed by the semiconductor layer reacting with metal,
an insulating film layer in contact with the compound layer, and
an electrode layer formed on the insulating film layer are laminated.

(9) The solid-state imaging device according to (8) above in which
the laminated structure is configured as a part of the AD conversion part.

(10) The solid-state imaging device according to (8) or (9) above in which
the semiconductor layer includes at least a first semiconductor layer and a second semiconductor layer, a plurality of the pixels is formed in the first semiconductor layer, and
the AD conversion part is formed in the second semiconductor layer.

(11) A method for manufacturing a semiconductor device, the method including:
forming an electrode layer on an insulating film layer; and
forming a compound layer, formed by a semiconductor layer reacting with metal, on a surface of the semiconductor layer so as to come into contact with the insulating film layer.

(12) The method for manufacturing a semiconductor device according to (11) above, the method including:
forming a field-effect transistor including silicide in the semiconductor layer with the electrode layer as a gate electrode; and
forming the compound layer by diffusing the silicide by electromigration.

(13) The method for manufacturing a semiconductor device according to (12) above in which
the insulating film layer includes a silicon oxide film ($SiO_2$), and
the silicide contains at least one or more metals of titanium (Ti), cobalt (Co), and nickel (Ni).

(14) The method for manufacturing a semiconductor device according to (12) or (13) above in which
the silicide includes regions having different concentrations.

(15) The method for manufacturing a semiconductor device according to (14) above in which
the silicide has different concentrations in right and left regions relative to the gate electrode.

REFERENCE SIGNS LIST

10 Semiconductor layer
11 Compound layer
12 Insulating film layer
13 Electrode layer
110 Semiconductor layer
111 Silicide
112 Insulating film
113 Electrode
114 Sidewall
115 Insulating film
151, 151-1 to 151-3 Field-effect transistor
152, 152-1 to 152-3 Capacitive element
200 Solid-state imaging device
210 Pixel part
211 Pixel
250 AD converter
251 Comparator
293A, 293B, 296A Capacitor
311 Pixel 318 Second charge storage part
1000 Electronic equipment
1003 Solid-state imaging device
11402 Imaging part
12031 Imaging part

The invention claimed is:

1. A semiconductor device having a laminated structure in which
a compound layer formed on a surface of a semiconductor layer and formed by the semiconductor layer reacting with metal,
an insulating film layer in contact with the compound layer, and
an electrode layer formed on the insulating film layer are laminated,
wherein the electrode layer is configured as a gate electrode, and
a silicide layer has different concentrations in right and left regions relative to the gate electrode.

2. The semiconductor device according to claim 1, wherein
the insulating film layer includes a silicon oxide film ($SiO_2$), and
the compound layer includes a silicide layer using metal silicide.

3. The semiconductor device according to claim 2, wherein
the silicide layer contains at least one or more metals of titanium (Ti), cobalt (Co), and nickel (Ni).

4. The semiconductor device according to claim 3, wherein
the silicide layer includes regions having different concentrations.

5. The semiconductor device according to claim 1, wherein
the electrode layer is configured as a gate electrode, and
the laminated structure is configured as a part of a structure corresponding to a field-effect transistor.

6. The semiconductor device according to claim 5, wherein
the structure includes a planar structure, a trench-gate structure, or a fin structure.

7. A solid-state imaging device comprising:
a pixel part in which pixels each having a photoelectric conversion part are arranged two-dimensionally; and
an analog-to-digital (AD) conversion part that converts analog signals from a plurality of the pixels into digital signals,
the solid-state imaging device having a laminated structure in which
a plurality of the pixels and the AD conversion part are formed on a semiconductor layer, and
a compound layer formed on a surface of the semiconductor layer and formed by the semiconductor layer reacting with metal,
an insulating film layer in contact with the compound layer, and
an electrode layer formed on the insulating film layer are laminated.

8. The solid-state imaging device according to claim 7, wherein
the laminated structure is configured as a part of the AD conversion part.

9. The solid-state imaging device according to claim 8, wherein
the semiconductor layer includes at least a first semiconductor layer and a second semiconductor layer,
a plurality of the pixels is formed in the first semiconductor layer, and
the AD conversion part is formed in the second semiconductor layer.

10. A method for manufacturing a semiconductor device, the method comprising:
forming an electrode layer on an insulating film layer; and
forming a compound layer, formed by a semiconductor layer reacting with metal, on a surface of the semiconductor layer so as to come into contact with the insulating film layer,
forming a field-effect transistor including silicide in the semiconductor layer with the electrode layer as a gate electrode; and
forming the compound layer by diffusing the silicide by electromigration.

11. The method for manufacturing a semiconductor device according to claim 10, wherein
the insulating film layer includes a silicon oxide film ($SiO_2$), and the silicide contains at least one or more metals of titanium (Ti), cobalt (Co), and nickel (Ni).

12. The method for manufacturing a semiconductor device according to claim 11, wherein
the silicide includes regions having different concentrations.

13. The method for manufacturing a semiconductor device according to claim 12, wherein
the silicide has different concentrations in right and left regions relative to the gate electrode.

* * * * *